(12) United States Patent
Kim et al.

(10) Patent No.: US 11,455,055 B2
(45) Date of Patent: Sep. 27, 2022

(54) DISPLAY DEVICE WHICH MINIMIZES DEAD SPACE

(71) Applicant: Samsung Display Co., Ltd., Yongin-si (KR)

(72) Inventors: Mi Young Kim, Yongin-si (KR); Kwang Hyeok Kim, Yongin-si (KR); So Yeon Park, Yongin-si (KR); Yong Hwan Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/096,710

(22) Filed: Nov. 12, 2020

(65) Prior Publication Data

US 2021/0278948 A1    Sep. 9, 2021

(30) Foreign Application Priority Data

Mar. 3, 2020    (KR) .................. 10-2020-0026688

(51) Int. Cl.
| | | |
|---|---|---|
| *G06F 3/041* | (2006.01) | |
| *G06F 3/044* | (2006.01) | |
| *H01L 27/32* | (2006.01) | |
| *H01L 51/00* | (2006.01) | |

(52) U.S. Cl.
CPC .......... *G06F 3/04164* (2019.05); *G06F 3/044* (2013.01); *H01L 27/323* (2013.01); *H01L 27/3276* (2013.01); *H01L 51/0097* (2013.01); *H01L 2251/5338* (2013.01)

(58) Field of Classification Search
CPC ... G06F 3/04164; G06F 3/044; H01L 27/323; H01L 27/3276; H01L 51/0097; H01L 2251/5338; H01L 27/32; H01L 51/52; Y02E 10/549
See application file for complete search history.

(56) References Cited

U.S. PATENT DOCUMENTS

| | | | |
|---|---|---|---|
| 9,343,519 B2 | 5/2016 | Lee et al. | |
| 9,815,087 B2 | 11/2017 | Ganti et al. | |
| 2018/0136775 A1 | 5/2018 | Ng et al. | |
| 2019/0138150 A1 | 5/2019 | Kim et al. | |
| 2019/0235690 A1 | 8/2019 | Lee et al. | |
| 2020/0026384 A1* | 1/2020 | Rhe ...................... | G06F 3/0443 |

FOREIGN PATENT DOCUMENTS

| | | |
|---|---|---|
| KR | 10-2019-0053049 | 5/2019 |
| KR | 10-1996984 | 7/2019 |

* cited by examiner

*Primary Examiner* — David D Davis
(74) *Attorney, Agent, or Firm* — H.C. Park & Associates, PLC

(57) ABSTRACT

A display device including a substrate including a display area including a plurality of pixels and a non-display area adjacent to the display area, a plurality of sensing electrodes disposed to overlap with the display area, a plurality of display pads disposed along a first direction in the non-display area, a plurality of sensing pads disposed between the display pads, and a multiplexer electrically connecting the sensing electrodes and the sensing pads. The multiplexer is adjacent to at least one of the sensing pads in the first direction.

20 Claims, 19 Drawing Sheets

DISPLAY DEVICE WHICH MINIMIZES DEAD SPACE

CROSS-REFERENCE TO RELATED APPLICATION

This application claims priority from and the benefit of Korean Patent Application No. 10-2020-0026688 filed on Mar. 3, 2020, which is hereby incorporated by reference for all purposes as if fully set forth herein.

BACKGROUND

Field

Exemplary embodiments of the invention relate generally to a display device.

Discussion of the Background

The importance of display devices is increasing with the development of multimedia. Because of this increasing importance, various types of display devices, such as a liquid crystal display (LCD) device and an organic light-emitting display (OLED) device, have increasingly been utilized.

An organic light-emitting display device displays an image using an organic light-emitting element (OLED) that generates light by recombination of electrons and holes. An organic light-emitting display device is advantageous in that it has a fast response speed, its luminance and viewing angle are large, and it is simultaneously driven with low power consumption.

The above information disclosed in this Background section is only for understanding of the background of the inventive concepts, and, therefore, it may contain information that does not constitute prior art.

SUMMARY

Various embodiments of the present disclosure are directed to a display device which minimizes dead space.

Additional features of the inventive concepts will be set forth in the description which follows, and in part will be apparent from the description, or may be learned by practice of the inventive concepts.

The effects of the present disclosure are not limited to the above-stated effects, and those skilled in the art will clearly understand other non-mentioned effects from the accompanying claims.

An embodiment of the present disclosure provides a display device including a substrate having a display area including a plurality of pixels, and a non-display area adjacent to the display area. The display device further includes a plurality of sensing electrodes disposed to overlap with the display area; a plurality of display pads disposed along a first direction in the non-display area; a plurality of sensing pads disposed between the display pads; and a multiplexer electrically connecting the sensing electrodes and the sensing pads. The multiplexer may be adjacent to at least one of the sensing pads in the first direction.

The plurality of sensing pads may include a first sensing pad disposed on a first side of the display pad, and a second sensing pad disposed on a second side of the display pad.

The multiplexer may be disposed between the first sensing pad and the second sensing pad.

The multiplexer may be adjacent to the first sensing pad and the second sensing pad in the first direction.

The display device may further include a first pad line electrically connecting the first sensing pad and the multiplexer; and a second pad line electrically connecting the second sensing pad and the multiplexer.

The multiplexer may be disposed between the sensing pad and the display pad.

The multiplexer may be adjacent to the sensing pad and the display pad in the first direction.

The display device may further include a plurality of fan-out lines electrically connecting the display pad and the pixel.

The display device may further include a plurality of sensing connection lines electrically connecting the sensing electrodes and the multiplexer; and a plurality of pad lines electrically connecting the multiplexer and the sensing pads. The number of the sensing connection lines may be greater than the number of the pad lines.

The substrate may include a bending area; a main area located on a first side of the bending area; and a sub-area extending from a second side of the bending area. The multiplexer may be disposed in the sub-area.

The main area and the sub-area may overlap with each other in a third direction.

The display device may further include a plurality of sensing connection lines electrically connecting the sensing electrodes and the multiplexer. Each of the sensing connection lines may include a main sensing connection line disposed in the main area; a sub-sensing connection line disposed in the sub-area; and a bending sensing connection line disposed in the bending area, and electrically connecting the main sensing connection line and the sub-sensing connection line.

The main sensing connection line may include first-to-third main sensing connection lines formed of different conductive layers.

The first main sensing connection line may be formed of the same conductive layer as the sensing electrode.

The second main sensing connection line may be formed of the same conductive layer as the bending sensing connection line.

A first end of the second main sensing connection line may be in contact with the first main sensing connection line, and a second end of the second main sensing connection line may be in contact with the third main sensing connection line.

A first end of the third main sensing connection line may be in contact with the second main sensing connection line, and a second end of the third main sensing connection line may be in contact with the bending sensing connection line.

The display device may further include a plurality of fan-out lines electrically connecting the display pad and the pixel. Each of the fan-out lines may include a main fan-out line disposed in the main area; a sub fan-out line disposed in the sub-area; and a bending fan-out line electrically connecting the main fan-out line and the sub fan-out line.

The bending sensing connection line and the bending fan-out line may be formed of the same conductive layer.

The bending fan-out line may be formed of a first conductive layer, and the bending sensing connection line may be formed of a second conductive layer, with an insulating layer being disposed between the first conductive layer and the second conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
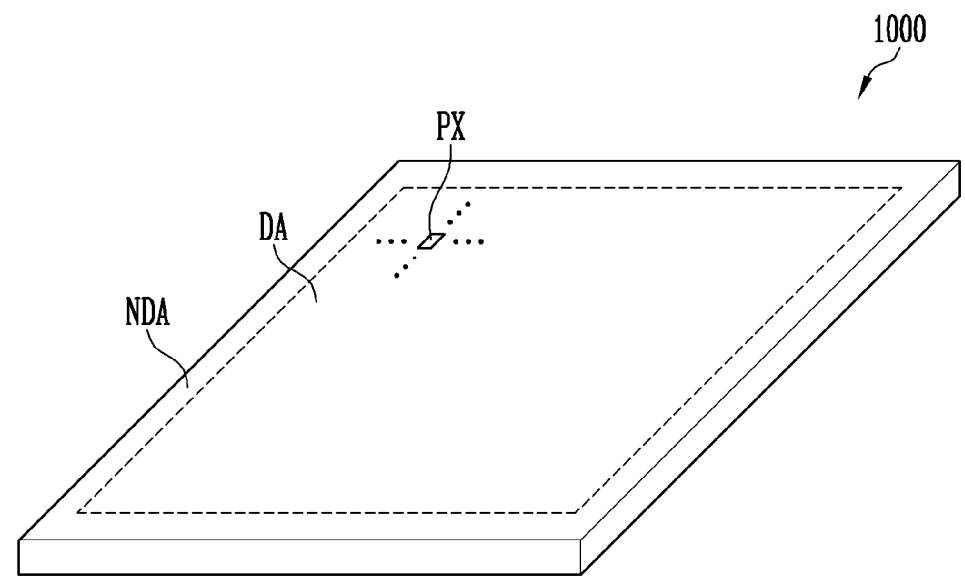
FIG. 1 is a perspective view illustrating a display device in accordance with an embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
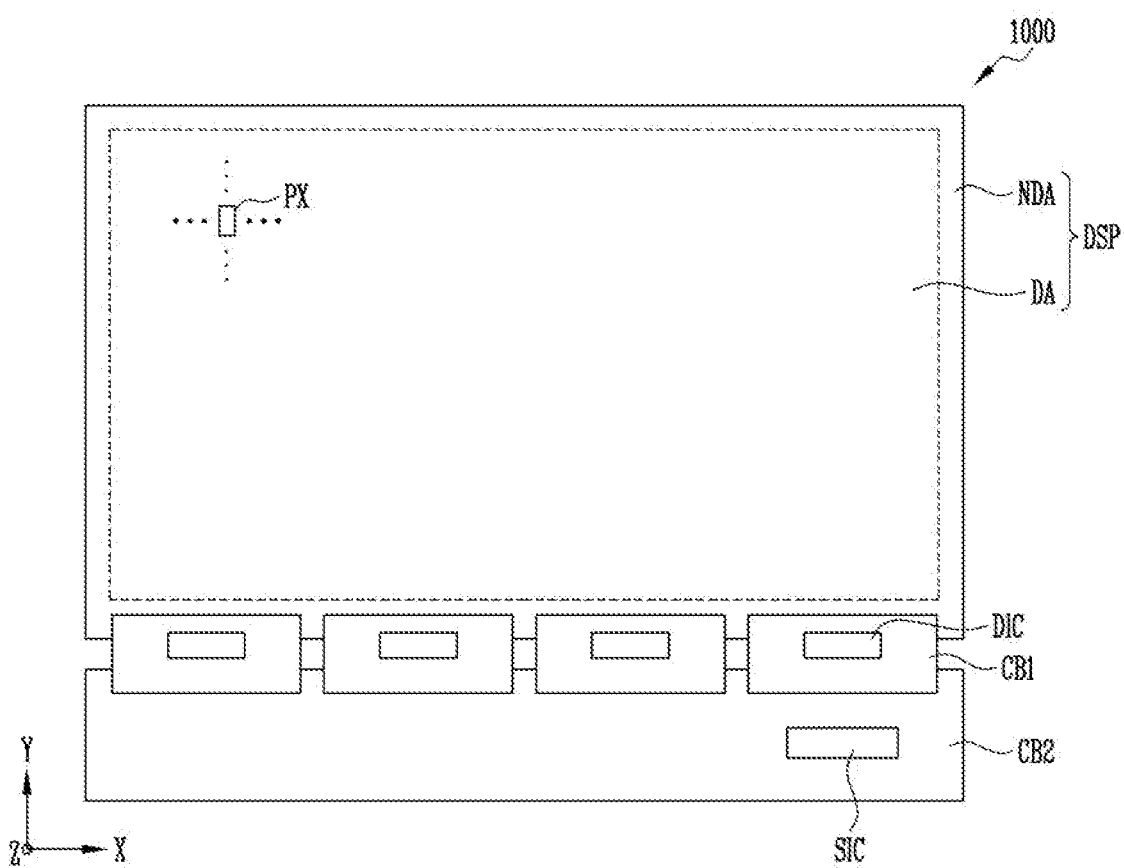
FIG. 2 is a plan view illustrating the display device in accordance with an embodiment.

FIG. 1 is a perspective view illustrating a display device in accordance with an embodiment. FIG. 2 is a plan view illustrating the display device in accordance with an embodiment.

Herein, terms "upper", "top", and "upper surface" indicate an upper direction with respect to a display device 1000, namely, a Z-axis direction, while terms "lower", "bottom", and "lower surface" indicate a lower direction with respect to the display device 1000, namely, an opposite direction of the Z-axis direction. Furthermore, terms "left", "right", "upper", and "lower" refer to directions when viewing the display device 1000 from a plane. For example, the term "left" refers to an opposite direction of an X-axis direction, the term "right" refers to the X-axis direction, the term "upper" refers to a Y-axis direction, and the term "lower" refers to a direction opposite to the Y-axis direction.

Referring to FIGS. 1 and 2, the display device 1000 may be applied to various electronic devices, for instance, small- and medium-sized electronic equipment, such as a tablet PC, a smartphone, a car navigation unit, a camera, a center information display (CID) provided in a car, a watch-type electronic device, a personal digital assistant (PDA), a portable multimedia player (PMP), or a game console, and medium- and large-sized electronic equipment, such as a television, an outdoor billboard, a monitor, a personal computer, or a notebook computer. These are only examples, and the display device may be naturally employed in other electronic devices without departing from the scope of the present disclosure.

The display device 1000 may have a rectangular shape on a plane. For instance, the display device 1000 may have the shape of a rectangle that has short sides in a first direction (X-axis direction) and long sides in a second direction (Y-axis direction). A corner at which the short side of the first direction (X-axis direction) and the long side of the second direction (Y-axis direction) meet may be rounded to have a predetermined curvature or formed at right angles. The display device 1000 is not limited to the rectangular shape on a plane, but may be formed in the shape of other polygons, a circle, or an ellipse.

The display device 1000 may include a display panel DSP. The display panel DSP may be a light emitting display panel including a light emitting element. For example, the display panel DSP may be an organic light emitting display panel using an organic light emitting diode, a sub-miniature light emitting diode display panel using a micro LED, and a quantum dot light emitting display panel including a quantum dot light emitting diode. Hereinafter, an example in which the display panel DSP is the organic light emitting display panel will be described.

The display panel DSP may include a display area DA on which an image is displayed, and a non-display area NDA excluding the display area DA.

The display area DA may be a region in which a plurality of pixels PX are provided. The display area DA may be disposed on a front or a side of the display device 1000. The plurality of pixels PX may be provided in the display area DA.

Each of the pixels PX may emit light having any one color among red, green, and blue, but the inventive concepts are not limited thereto. For example, each pixel PX may emit light having any one color among cyan, magenta, yellow, and white.

The plurality of pixels PX may be arranged in the form of a matrix while forming a row and a column in the first direction (X-axis direction) and the second direction (Y-axis direction) intersecting with the first direction (X-axis direction). However, the arrangement of the pixels PX is not limited thereto, and may be modified in various forms.

The non-display area NDA may be a region in which drivers for driving the plurality of pixels PX and various lines (not illustrated) for coupling the pixels PX to the drivers are provided. The non-display area NDA may be disposed on at least one side of the display area DA. For instance, the non-display area NDA may be disposed to enclose the display area DA.

A first end of a first circuit board CB1 may be attached to a first end of the display panel DSP. The first end of the first circuit board CB1 may be attached to the first end of the display panel DSP using an anisotropic conductive film. The first circuit board CB1 may be a flexible printed circuit board (FPCB), a printed circuit board (PCB), or a flexile film, such as a chip-on-film (COF). The first circuit board CB1 may be bent to a lower surface of the display panel DSP. The first circuit board CB1 may be a region in which a display drive circuit DIC is provided.

The display drive circuit DIC may output signals and voltages for driving the display panel DSP. For instance, the display drive circuit DIC may supply data voltage to a data line. Furthermore, the display drive circuit DIC may supply a power supply voltage to a power supply line, and supply a scan control signal to a gate driver. The display drive circuit DIC may be formed as an integrated circuit (IC), and may be disposed on the first circuit substrate CB1 in a chip-on-glass (COG) method, a chip-on-plastic (COP) method, or an ultrasonic bonding method. However, the inventive concepts are not limited thereto. As another example, the display drive circuit DIC may be mounted on a second circuit board CB2.

The second circuit board CB2 may be attached to a second end of the first circuit board CB1. The second circuit board CB2 may be a flexible printed circuit board (FPCB), a printed circuit board (PCB), or a flexible film, such as a chip-on-film (COF). The second circuit board CB2 may be a region in which a sensing drive circuit SIC is provided.

The sensing drive circuit SIC may be disposed on the second circuit board CB2. For example, the sensing drive circuit SIC may be formed as the integrated circuit IC to be mounted on the second circuit substrate CB2, and may be electrically coupled to pads of the display panel DSP through a connection line.

The sensing drive circuit SIC may be coupled to a plurality of sensing electrodes of a sensing layer (TSL of FIG. 4) of the display panel DSP. Such a sensing drive circuit SIC may measure a change in capacitance of the sensing electrodes of the sensing layer TSL. The sensing drive circuit SIC may determine whether or not a user touches, and a position in which a user touches, on the basis of a change in capacitance of the sensing electrodes. Here, the user's touch may mean that an object, such as a user's finger or a pen, is in direct contact with a surface of the display device 1000 disposed on the sensing layer TSL. Moreover, the sensing drive circuit SIC may determine a position in which a user's touch occurs by distinguishing a portion having a user's touch and a portion having no touch from each other, among the plurality of sensing electrodes.

Figure 3:
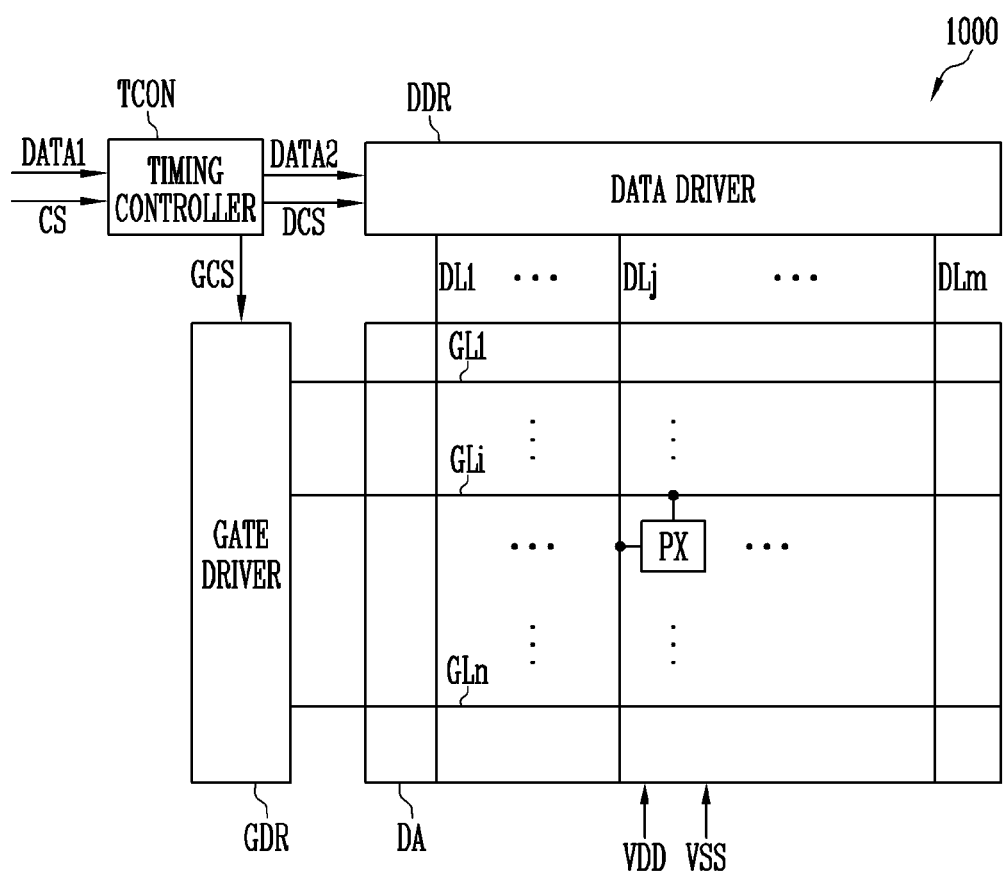
FIG. 3 is a schematic block diagram illustrating the display device in accordance with an embodiment.

FIG. 3 is a schematic block diagram illustrating the display device in accordance with an embodiment.

Referring to FIG. 3, the display device 1000 may include a gate driver GDR, a data driver DDR, and a timing controller TCON.

The plurality of pixels PX are positioned at intersections of a plurality scan lines GL1 to GLn (n is a positive integer) and a plurality of data lines DL1 to DLm (m is a positive integer), and is arranged in a matrix form. Each of the pixels PX may be coupled to at least one of the scan lines GL1 to GLn and at least one of the data lines DL1 to DLm.

The plurality of scan lines GL1 to GLn may extend in a row direction, while the plurality of data lines DL1 to DLm may extend in a column direction. The row direction and the column direction may be exchanged with each other.

Each of the pixels PX may be provided with first and second power supplies VDD and VSS. The first and second power supplies VDD and VSS may be voltages required to operate the pixel PX. The first power supply VDD may have a higher voltage level than the second power supply VSS.

The gate driver GDR may receive a gate control signal GCS, such as a scan start signal and a clock signal, from the timing controller TCON. The gate driver GDR may be provided with third and fourth power supplies required to operate the gate driver GDR. For example, the third power supply may be a logic high level voltage, and the fourth power supply may a logic low level voltage.

The gate driver GDR may generate a scan signal, and sequentially provide the scan signal to the scan lines GL1 to GLn. The gate driver GDR may include a shift register (or stage) that sequentially generates and outputs a scan signal in a pulse form corresponding to a start signal in a pulse form using the clock signal of the gate control signal GCS. The scan signal in the pulse form generated from the gate driver GDR may be applied to each pixel PX.

The data driver DDR may generate data signals on the basis of image data DATA2 provided from the timing controller TCON and the data control signal DCS, and provide the data signals to the pixel PX. Here, the data control signal DCS may be a signal for controlling the operation of the data driver DDR, and include a load signal (or a data enable signal) for instructing to output a valid data signal. The pixel PX may receive the data signal through the data lines DL1 to DLm, and emit light with luminance corresponding to the data signal.

The timing controller TCON may receive input image data DATA1 and a control signal CS from an external device (e.g. graphic processor), generate a gate control signal GCS and a data control signal DCS on the basis of the control signal CS, and convert input image data DATA1 to generate image data DATA2.

Figure 4:
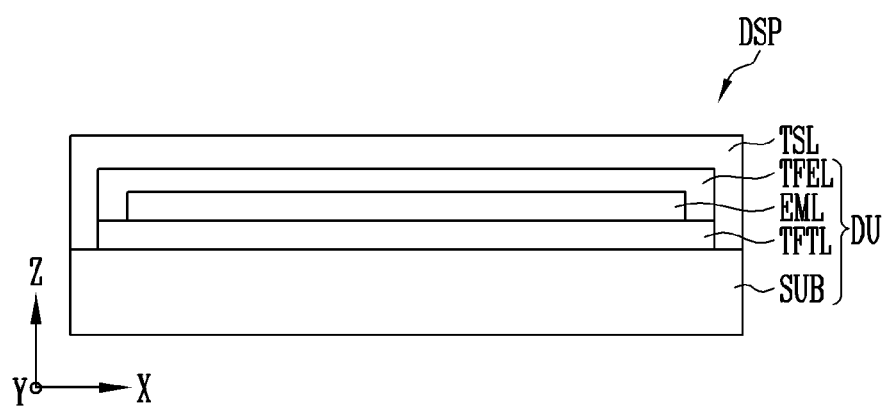
FIG. 4 is a sectional view illustrating a display panel in accordance with an embodiment.

FIG. 4 is a sectional view illustrating a display panel in accordance with an embodiment.

Referring to FIG. 4, the display panel DSP may include a display unit DU, and a sensing layer TSL disposed on the display unit DU.

The display unit DU may include a substrate SUB, a thin film transistor layer TFTL disposed on the substrate SUB, a light emitting element layer EML disposed on the thin film transistor layer TFTL, and a thin film encapsulation layer TFEL covering the thin film transistor layer TFTL and the light emitting element layer EML.

The substrate SUB may be formed of insulation materials, such as glass, quartz, and polymer resin. For example, the polymer resin may be selected from polyethersulphone (PES), polyacrylate (PA), polyarylate (PAR), polyetherimide (PEI), polyethylenenapthalate (PEN), polyethyleneterephtalate (PET), polyphenylenesulfide (PPS), polyallylate, polyimide (PI), polycarbonate (PC), cellulose triacetate (CAT), cellulose acetate propionate (CAP), or combinations thereof. As another example, the substrate SUB may include metal material.

The substrate SUB may be a rigid substrate, or a flexible substrate that is bendable, foldable or rollable. If the substrate SUB is a flexible substrate, the substrate may be formed of polyimide (PI), but is not limited thereto.

The thin film transistor layer TFTL may be disposed on the substrate SUB. The thin film transistors of the respective pixels, the scan lines, the data lines, the power lines, the scan control lines, and routing lines connecting pads and the data lines may be formed on the thin film transistor layer TFTL. Each of the thin film transistors may include a semiconductor layer, a gate electrode, a source electrode, and a drain electrode.

The thin film transistor layer TFTL may be disposed on the display area DA and the non-display area NDA. To be more specific, the thin film transistors of the respective pixels of the thin film transistor layer TFTL, the scan lines, the data lines, and the power lines may be formed on the display area DA. The scan control lines and link lines of the thin film transistor layer TFTL may be disposed in the non-display area NDA.

A light emitting element layer EML may be disposed on the thin film transistor layer TFTL. The light emitting element layer EML may include pixels including a first electrode, a light emitting layer, and a second electrode, and a pixel defining layer defining the pixels. Here, the light emitting layer may be an organic light emitting layer including organic matter. The light emitting layer may include a hole transporting layer, an organic light emitting layer, and an electron transporting layer. For instance, the first electrode may receive a predetermined voltage through the thin film transistor of the thin film transistor layer TFTL, and the second electrode may receive a cathode voltage. Unless each of the first and second electrodes receives a predetermined voltage, the hole and the electron may be transported, respectively, through the hole transporting layer and the electron transporting layer to the organic light emitting layer, and may combine with each other on the organic light emitting layer so that the organic light emitting layer may emit light.

The thin film encapsulation layer TFEL may be disposed on the light emitting element layer EML to cover the thin film transistor layer TFTL and the light emitting element layer EML. The thin film encapsulation layer TFEL may prevent oxygen or moisture from penetrating the light emitting element layer EML. To this end, the thin film encapsulation layer TFEL may include at least one inorganic layer. For example, the inorganic layer may be a silicon nitride layer, a silicon oxy nitride layer, a silicon oxide layer, a titanium oxide layer, or an aluminum oxide layer, but is not limited thereto. Furthermore, the thin film encapsulation layer TFEL may protect the light emitting element layer EML from foreign substance such as dust. To this end, the thin film encapsulation layer TFEL may include at least one organic layer. For example, the organic layer may be acryl resin, epoxy resin, phenolic resin, polyamide resin, or polyimide resin, but is not limited thereto.

The thin film encapsulation layer TFEL may be disposed in both the display area DA and the non-display area NDA. To be more specific, the thin film encapsulation layer TFEL may cover the light emitting element layer EML of the display area DA and the non-display area NDA, and may be disposed to cover the thin film transistor layer TFTL of the non-display area NDA.

The sensing layer TSL may be disposed on the thin film encapsulation layer TFEL. A configuration in which the sensing layer TSL is directly disposed on the thin film encapsulation layer TFEL can reduce the thickness of the display device 1000, as compared to a configuration in which a separate sensing panel including the sensing layer TSL is attached to the thin film encapsulation layer TFEL.

The sensing layer TSL may include sensing electrodes for sensing a user's touch in a self-capacitance method, and sensing lines connecting the pads and the sensing electrodes. The sensing electrodes of the sensing layer TSL may be disposed in a sensing region overlapping with the display area DA. The sensing layer TSL will be described below in detail with reference to FIGS. 6 to 10.

Figure 5:
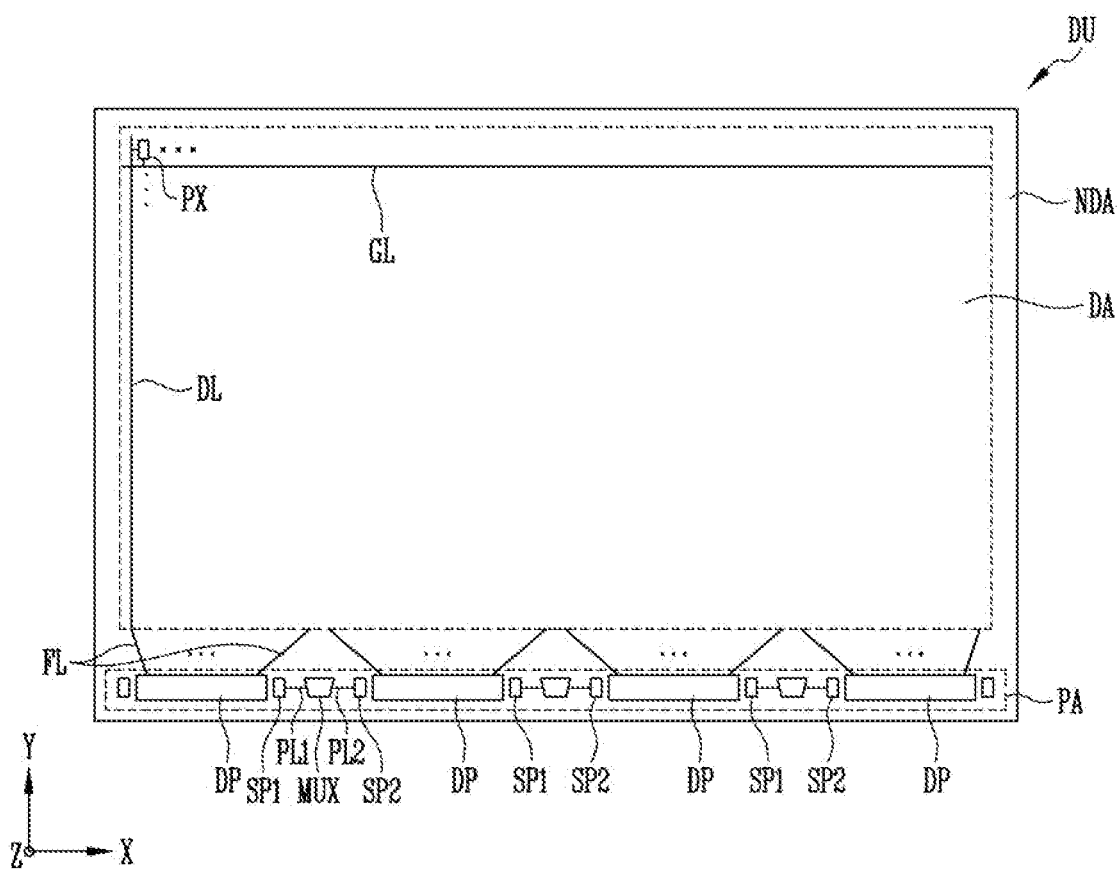
FIG. 5 is a plan view illustrating a configuration related to a display unit of FIG. 4.

FIG. 5 is a plan view illustrating the configuration related to the display unit of FIG. 4.

Referring to FIG. 5, a plurality of pixels PX, scan lines GL, and data lines DL may be disposed in the display area DA. The scan lines GL may be coupled to the gate driver GDR to be formed in parallel with the first direction (X-axis direction). The data lines DL may be coupled to the data driver DDR to be formed in parallel with the second direction (Y-axis direction). Each of the pixels PX may be coupled to at least one of the scan lines GL and any one of the data lines DL.

A pad region PA may be disposed in the non-display area NDA. A plurality of display pads DP and sensing pads SP1 and SP2 may be disposed in the pad region PA.

The plurality of display pads DP may be disposed in the first direction (X-axis direction) on the pad region PA. The plurality of display pads DP may be electrically coupled to the display drive circuit DIC. The display drive circuit DIC may convert digital video data into analog positive/negative data voltages to supply the voltages through a fan-out line FL to the data line DL.

The fan-out line FL may be disposed in the non-display area NDA. The fan-out line FL may extend from the display pad DP to a boundary between the display area DA and the non-display area NDA. A first end of the fan-out line FL may be electrically coupled to the data line DL, while a second end of the fan-out line FL may be electrically coupled to the display pad DP.

The plurality of sensing pads SP1 and SP2 may be disposed on one side and/or the other side of each of the plurality of display pads DP. The plurality of sensing pads SP1 and SP2 may be disposed in the space between adjacent display pads DP. The plurality of sensing pads SP1 and SP2 may include a first sensing pad SP1 disposed on one side of the display pad DP, and a second sensing pad SP2 disposed on the other side of the display pad DP. The first sensing pad SP1 may be adjacent to the display pad DP in the first direction (X-axis direction). The second sensing pad SP2 may be adjacent to the display pad DP in an opposite direction of the first direction (X-axis direction).

The plurality of sensing pads SP1 and SP2 may be electrically coupled to the sensing drive circuit SIC. The sensing drive circuit SIC may determine whether a user touches or not and a position in which a user touches by measuring a change in capacitance of the sensing electrodes through the sensing line. This will be described in detail with reference to FIGS. 6 to 8.

Figure 6:
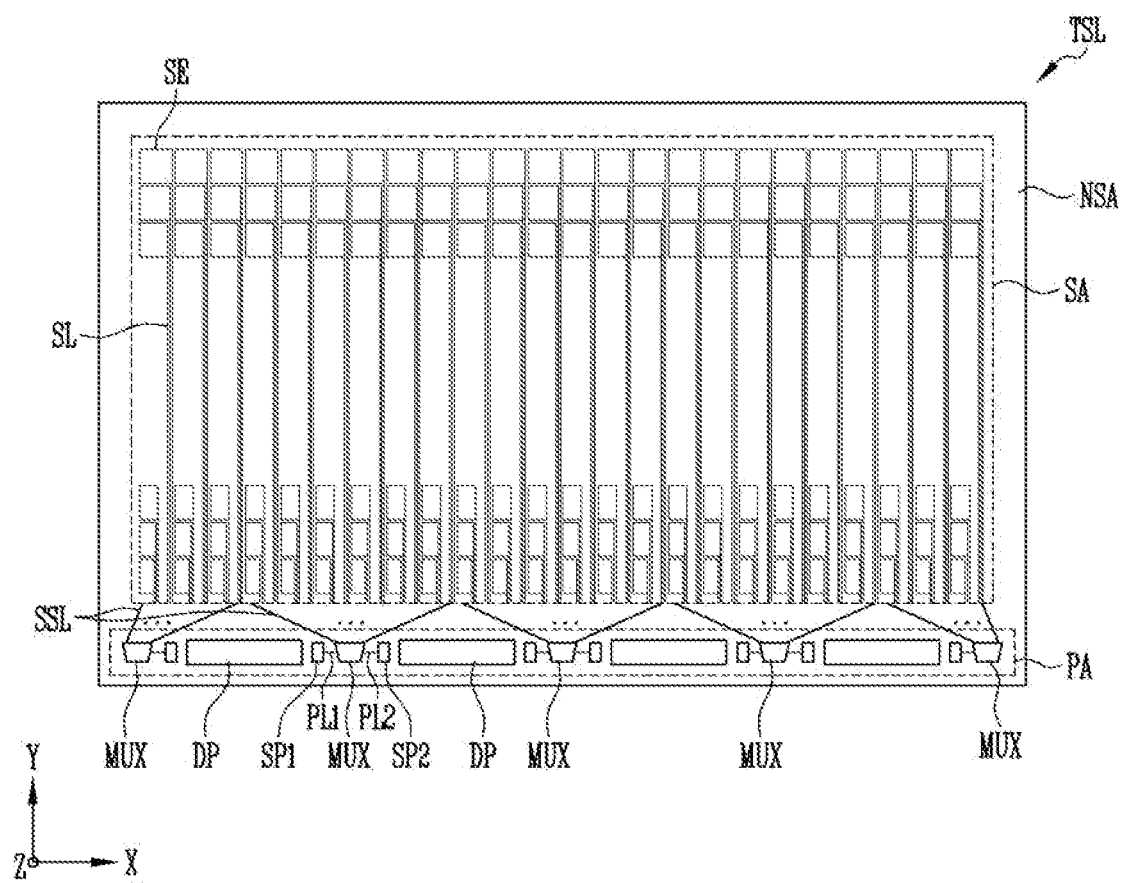
FIGS. 6, 7, and 8 are plan views illustrating a configuration related to a sensing layer stacked on the display unit of FIG. 5.
Figure 7:
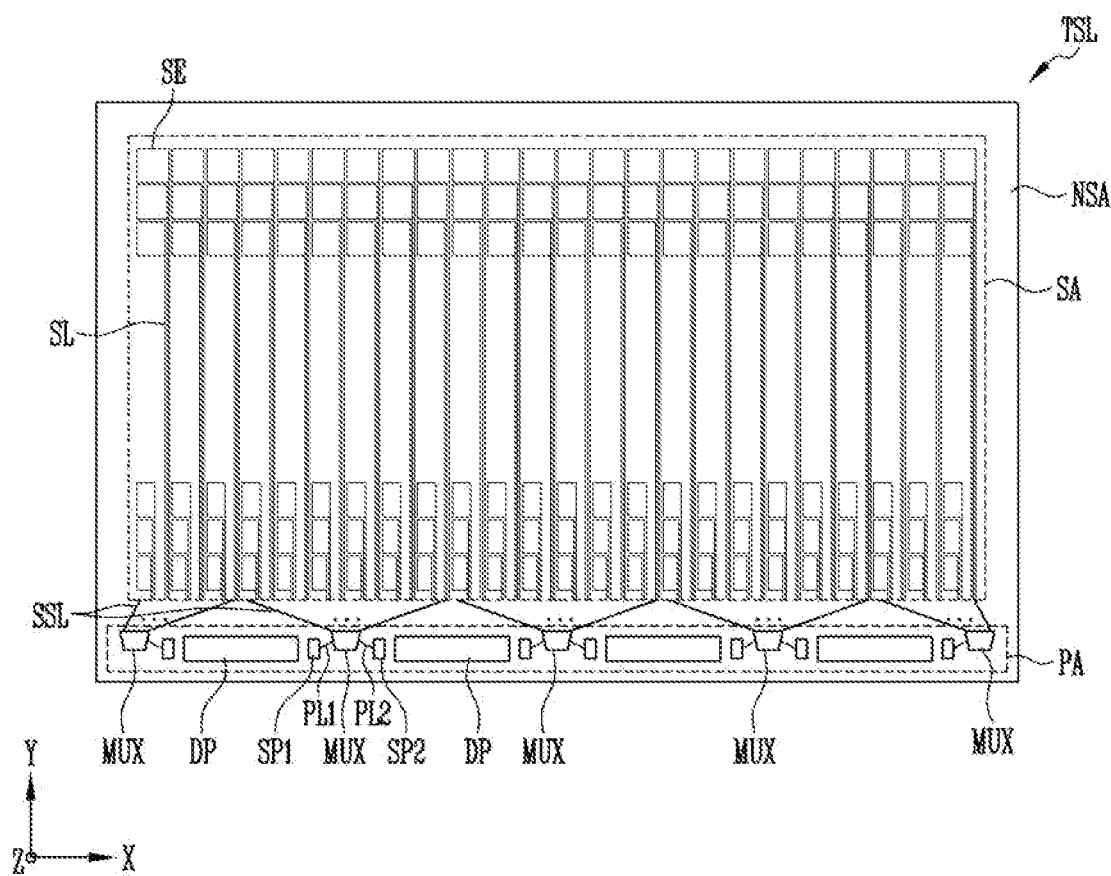
Figure 8:
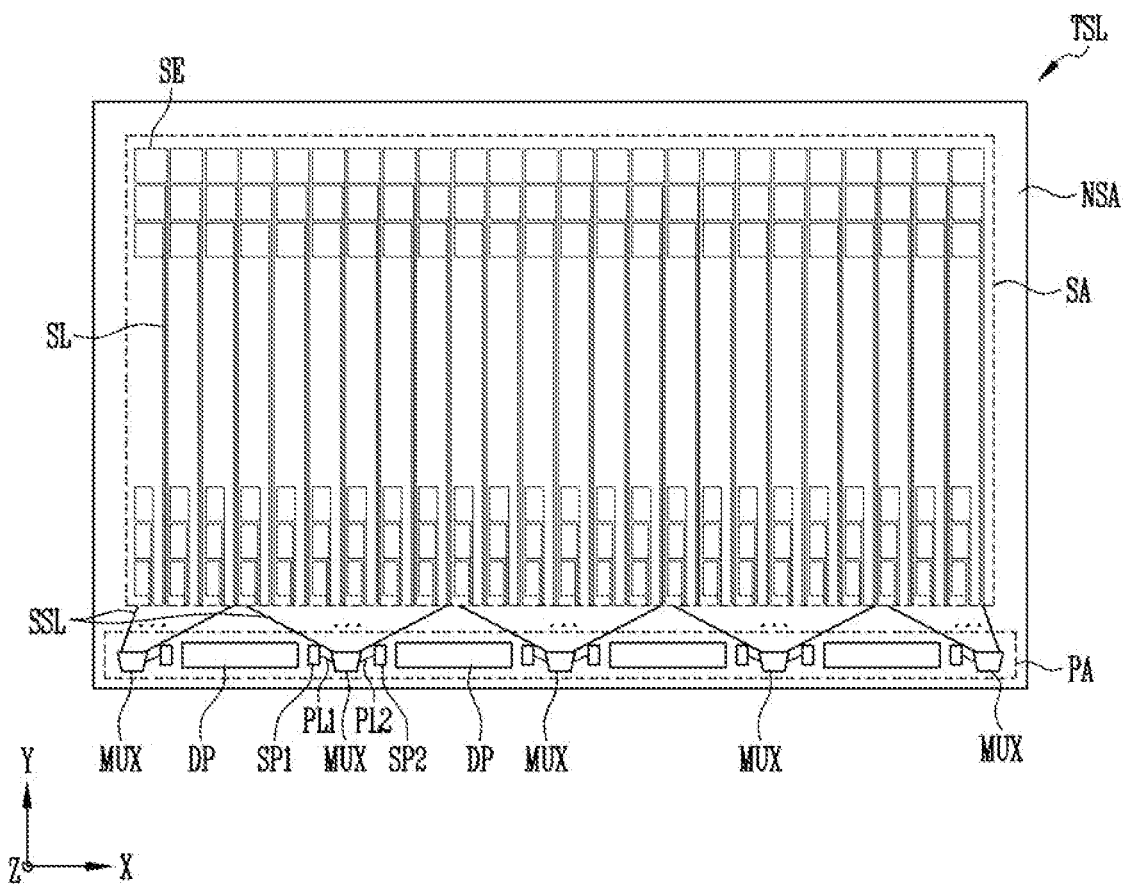

FIGS. 6 to 8 are plan views illustrating a configuration related to a sensing layer stacked on the display unit of FIG. 5.

Referring to FIG. 6, the sensing layer TSL may include a sensing region SA that may sense a user's touch, and a non-sensing region NSA excluding the sensing region SA. The sensing region SA may overlap with the display area DA of the display panel DSP.

A plurality of sensing lines SL coupled to the plurality of sensing electrodes SE may be disposed in the sensing region SA.

The plurality of sensing electrodes SE may sense a user's touch occurring on a surface of the display device 1000. The size of the sensing electrode SE may be set in view of a finger contact area and a pen contact area.

The sensing electrodes SE may be arranged in the form of a matrix including rows in the first direction (X-axis direction) and columns in the second direction (Y-axis direction).

Each of the sensing electrodes SE may be supplied with the sensing drive voltage. Each of the sensing electrodes SE may form a predetermined capacitance with the electrode or lines of the display unit DU. In this case, if a user's touch occurs, an additional capacitance is generated between the sensing electrodes SE and the user, so that the capacitance of the sensing electrodes SE may be changed. The sensing drive circuit SIC may sense the presence of the user's touch and the touch position, by sensing a change in capacitance formed on each of the sensing electrodes SE.

For instance, at least two sensing electrodes SE having different electrical nodes may be disposed in the row and column of each of the sensing electrodes SE. In other words, the sensing electrodes SE and the sensing lines SL of the sensing layer TSL may be formed in a self-capacitance method. Since this may result in an improved RC delay value as compared to a mutual capacitance method, the display device 1000 having a large area may be realized.

The sensing electrodes SE may be coupled to the sensing pads SP1 and SP2. To be more specific, the sensing electrodes SE may be electrically coupled to first ends of the sensing lines SL, and second ends of the sensing lines SL may be electrically coupled to sensing connection lines SSL. The sensing connection lines SSL may be coupled to pad lines PL1 and PL2 by a multiplexer MUX, and the pad lines PL1 and PL2 may be coupled to the sensing pads SP1 and SP2. Therefore, the sensing electrodes SE may be coupled through the sensing lines SL, the sensing connection lines SSL, the multiplexer MUX, and the pad lines PL1 and PL2 to the sensing pads SP1 and SP2, and consequently coupled to the sensing drive circuit SIC.

The first end of each of the sensing lines SL may be electrically coupled to the sensing electrode SE, while the second end of each of the sensing lines SL may be electrically coupled to the sensing connection line SSL. The sensing lines SL may extend in the second direction (Y-axis direction) on the sensing region SA.

The sensing electrodes SE and/or the sensing lines SL may be simultaneously formed by patterning one conductive layer. For example, the sensing electrodes SE and/or the sensing lines SL may be formed of an opaque low-resistance conductor. In this case, the sensing electrodes SE and/or the sensing lines SL may be formed in a mesh shape so as not to overlap with the pixels PX of the display panel DSP.

Alternatively, the sensing electrodes SE and/or the sensing lines SL may be formed such that different conductive layers may be coupled to each other through a via hole of the insulating layer. For example, the sensing electrodes SE and/or the sensing lines SL may be formed of a transparent conductive material, such as ITO. In this case, the sensing electrodes SE and/or the sensing lines SL may be formed in a plate shape to overlap with the pixels PX of the display panel DSP in a third direction (Z-axis direction).

The sensing connection line SSL may be disposed in the non-sensing region NSA.

The sensing connection line SSL may serve to couple the sensing line SL and the sensing pads SP1 and SP2. The first end of the sensing connection line SSL may be electrically coupled to the sensing line SL, while the second end of the sensing connection line SSL may be electrically coupled to the pad lines PL1 and PL2 by the multiplexer MUX.

The multiplexer MUX may couple at least one of the sensing connection lines SSL to the pad lines PL1 and PL2 in response to a sensing control signal. As the sensing connection line SSL and the pad lines PL1 and PL2 are coupled to each other by the multiplexer MUX, the number of the pad lines PL1 and PL2 may be less than the number of the sensing connection lines SSL. That is, the numbers of the pad lines PL1 and PL2 and the sensing pads SP1 and SP2 coupled to the pad lines PL1 and PL2 can be minimized as a result of the multiplexer MUX. Thus, since an additional space for arranging the sensing pads is not required, the non-display area NDA of the display device 1000, namely, a dead space, can be minimized.

The multiplexer MUX may be disposed in the pad region PA. To be more specific, the multiplexer MUX may be disposed in the space between the plurality of pads DP, SP1, and SP2 on the pad region PA. For instance, the first sensing pad SP1 and the second sensing pad SP2 may be disposed in the space between the display pads DP, and the multiplexer MUX may be disposed in the space between the first sensing pad SP1 and the second sensing pad SP2. The multiplexer MUX may be adjacent to the first sensing pad SP1 in the opposite direction of the first direction (X-axis direction). Furthermore, the multiplexer MUX may be adjacent to the second sensing pad SP2 in the first direction (X-axis direction). The multiplexer MUX may be disposed on the same line as the sensing pads SP1 and SP2 in the first direction (X-axis direction), but the inventive concepts are not limited thereto. For instance, as illustrated in FIG. 7, the multiplexer MUX may be adjacent to the plurality of pads DP, SP1, and SP2 in the first direction (X-axis direction), and may be disposed on a side in the second direction (Y-axis direction) based on the pads DP, SP1, and SP2. In other words, the multiplexer MUX may be disposed more adjacent to the sensing region SA than the pads DP, SP1, and SP2. Furthermore, as illustrated in FIG. 8, the multiplexer MUX may be adjacent to the plurality of pads DP, SP1, and SP2 in the first direction (X-axis direction), and may be disposed on an opposite side of the second direction (Y-axis direction) based on the pads DP, SP1, and SP2. In other words, the multiplexer MUX may be disposed more distant from the sensing region SA than the pads DP, SP1, and SP2.

As described above, when the multiplexer MUX is disposed in the space between the sensing pads SP1 and SP2, an additional space for disposing the multiplexer MUX on a lower end of the display panel DSP may not be required. Therefore, the non-display area NDA of the display device 1000, namely, the dead space can be minimized.

The multiplexer MUX will be described in detail with reference to FIG. 9.

Figure 9:
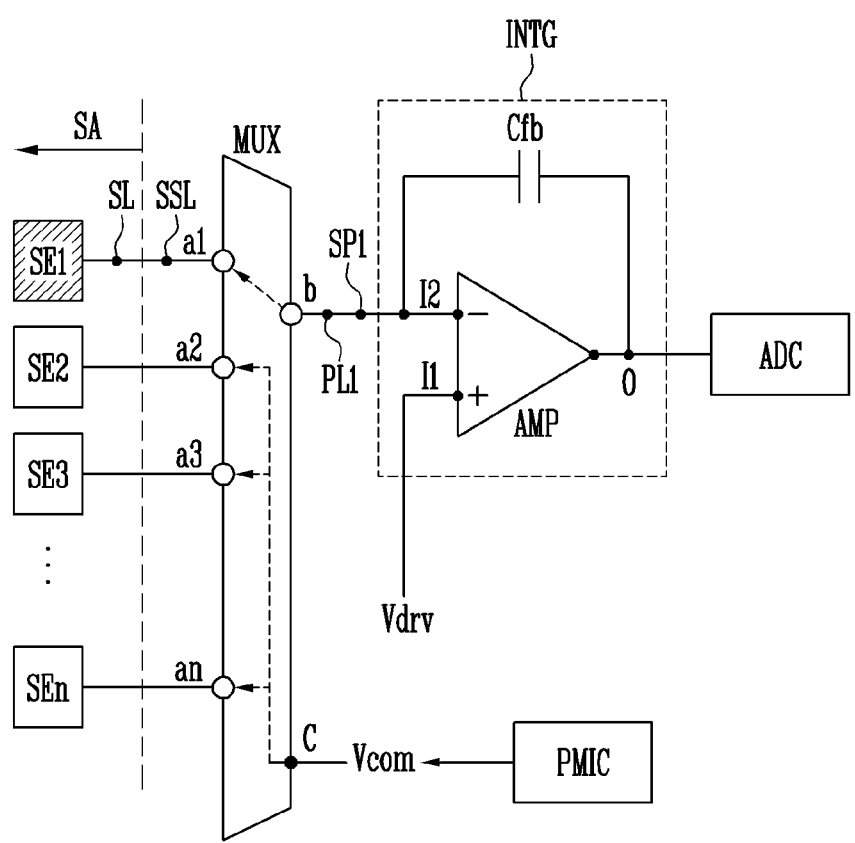
FIG. 9 is a circuit diagram of a configuration related to a multiplexer.

FIG. 9 is a circuit diagram of a configuration related to the multiplexer.

Referring to FIG. 9, the plurality of sensing electrodes SE1 to SEn may be coupled to an amplifier AMP through the multiplexer MUX.

The multiplexer MUX may selectively couple a sensing electrode SE1 that is a sensing target among n sensing electrodes SE1 to SEn to the amplifier AMP. A common voltage Vcom may be applied to sensing electrodes SE2 to SEn other than the sensing electrode SE1 that is the sensing target, but is not limited thereto. For instance, other sensing electrodes SE2 to SEn may be in a floating state. A power supply PMIC may generate the common voltage Vcom based on input power that is inputted from an external power supply, such as a battery.

An input terminal I2 of the amplifier AMP may be electrically coupled to the multiplexer MUX. The input terminal I2 may be an inverting terminal. In this case, a specific voltage, for example, a sensing drive signal Vdry may be applied to another input terminal I1 of the amplifier AMP. For example, the sensing drive signal Vdry may include square wave pulses. Another input terminal I1 may be a non-inverting terminal. The amplifier AMP may receive a sensing signal from the sensing electrode SE1 that is the sensing target. The amplifier AMP and a capacitor Cfb may act as an integrator INTG. A signal outputted to an output terminal O of the amplifier AMP may be inputted into an analog-digital converter ADC.

The signal outputted to the output terminal O may be converted into a digital value by the analog-digital converter ADC. The analog-digital converter ADC may output sensing data converted into the digital value to the sensing drive circuit SIC.

Turning back to FIG. 6, the multiplexer MUX and the sensing pads SP1 and SP2 may be electrically coupled by the pad lines PL1 and PL2.

The pad lines PL1 and PL2 may include a first pad line PL1 coupled to the first sensing pad SP1, and a second pad line PL2 coupled to the second sensing pad SP2.

A first end of the first pad line PL1 may be electrically coupled to the first sensing pad SP1, and a second end of the first pad line PL1 may be electrically coupled to the multiplexer MUX.

A first end of the second pad line PL2 may be electrically coupled to the second sensing pad SP2, and a second end of the second pad line PL2 may be electrically coupled to the multiplexer MUX.

Figure 10:
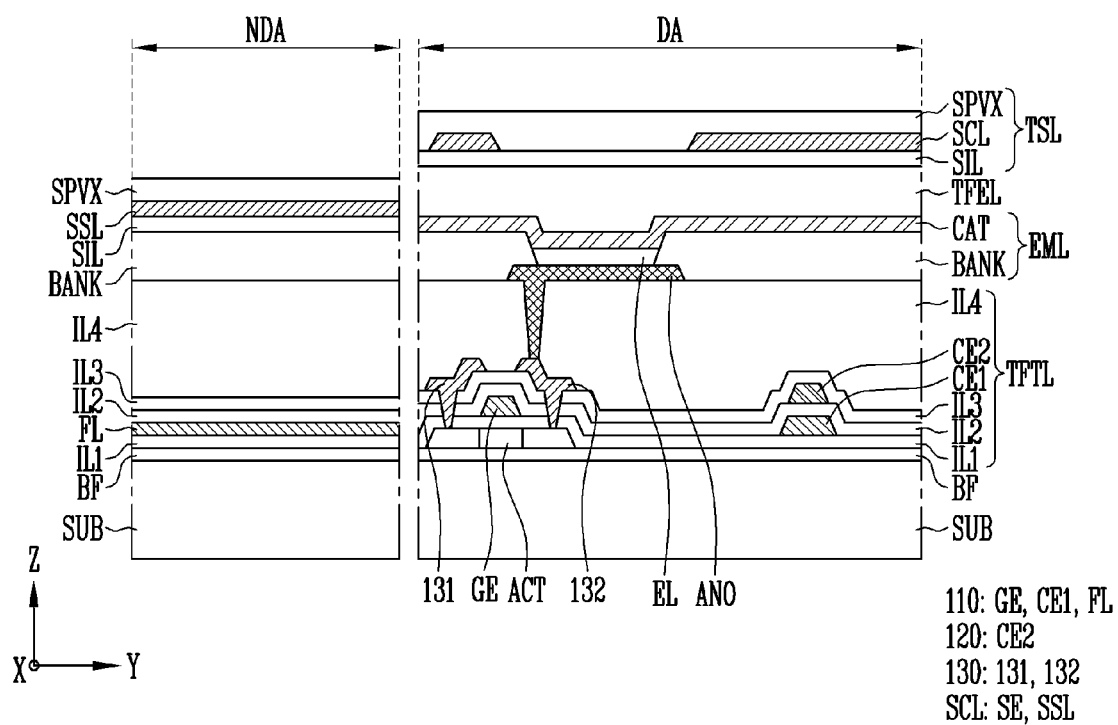
FIG. 10 is a sectional view illustrating a display panel in accordance with an embodiment.

FIG. 10 is a sectional view illustrating a display panel in accordance with an embodiment.

Referring to FIG. 10, the display panel DSP may include a substrate SUB, a buffer layer BF, a thin film transistor layer TFTL, a light emitting element layer EML, a thin film encapsulation layer TFEL, and a sensing layer TSL.

The substrate SUB may be a rigid substrate, or a flexible substrate that is bendable, foldable or rollable. The substrate SUB may be formed of insulation materials such as glass, quartz, and polymer resin. Examples of the polymer material may include polyethersulphone (PES), polyacrylate (PA), polyarylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof. The substrate SUB may include metal material.

The buffer layer BF may be disposed on the substrate SUB. The buffer layer BF may be disposed on the substrate SUB to protect the thin film transistors and the light emitting elements from moisture penetrating through the substrate SUB which is vulnerable to moisture permeation. The buffer layer BF may be formed of a plurality of inorganic layers alternately stacked. For example, the buffer layer BF may be a multi-layered structure formed by alternately stacking one or more inorganic films, such as a silicon oxide film ($SiO_x$) film, a silicon nitride film ($SiN_x$), and a silicon oxynitride film (SiON). The buffer layer BF may be omitted.

The thin film transistor layer TFTL may be disposed on the buffer layer BF. The thin film transistor layer TFTL may include an active layer ACT, a first insulating layer IL1, a first conductive layer 110, a second insulating layer IL2, a second conductive layer 120, a third insulating layer IL3, a third conductive layer 130, and a fourth insulating layer IL4.

The active layer ACT may be disposed on the buffer layer BF. The active layer ACT may be formed of silicon-based semiconductor material or oxide-based semiconductor material. A light shielding layer for shielding external light incident onto the active layer ACT may be further disposed between the buffer layer BF and the active layer ACT.

The first insulating layer IL1 may be disposed on the active layer ACT. The first insulating layer IL1 may be disposed on a front surface of the substrate SUB. The first insulating layer IL1 may be formed of an inorganic film, for example, a silicon oxide film ($SiO_x$), a silicon nitride film ($SiN_x$), or multiple films thereof.

The first conductive layer 110 may be disposed on the first insulating layer IL1. The first conductive layer 110 may be made of a single- or multi-layered structure including any one of molybdenum (Mo), aluminum (Al), chrome (Cr), gold (Au), titanium (Ti), nickel (Ni), neodymium (Nd), and copper (Cu) or an alloy thereof. The first conductive layer 110 may include a gate electrode GE of thin film transistors, a first electrode CE1 of a storage capacitor, and the above-described fan-out line FL.

The second insulating layer IL2 may be disposed on the first conductive layer 110. The second insulating layer IL2 may be disposed on the front surface of the substrate SUB. The second insulating layer IL2 may include the same material as the first insulating layer ILL or include one or more materials selected from materials forming the first insulating layer IL1.

The second conductive layer 120 may be disposed on the second insulating layer IL2. The second conductive layer 120 may include the same material as the first conductive layer 110, or include one or more materials selected from materials forming the first conductive layer 110. The second conductive layer 120 may include a second electrode CE2 of the storage capacitor.

The third insulating layer IL3 may be disposed on the second conductive layer 120. The third insulating layer IL3 may be disposed on the front surface of the substrate SUB. The third insulating layer IL3 may include the same material as the first insulating layer ILL or include one or more materials selected from materials forming the first insulating layer IL1.

The third conductive layer 130 may be disposed on the third insulating layer IL3. The third conductive layer 130 may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The third conductive layer 130 may be a single-layer structure or a multi-layer structure. For example, the third conductive layer 130 may be formed of a stacked structure, such as Ti/Al/Ti, Mo/Al/Mo, Mo/AlGe/Mo, or Ti/Cu. The third conductive layer 130 may include a source electrode 131 and a drain electrode 132 of the thin film transistors. Each of the source electrode 131 and the drain electrode 132 may be coupled to the active layer ACT through the contact hole that is formed through the first insulating layer IL1, the second insulating layer IL2, and the third insulating layer IL3.

The fourth insulating layer IL4 may be disposed on the third conductive layer 130. The fourth insulating layer IL4 may be a via layer. The fourth insulating layer IL4 may include organic insulating material such as polyacrylate-based resin, epoxy resin, phenolic resin, polyamide-based resin, polyimide-based resin, unsaturated polyesters resin, polyphenylen ether-based resin, polyphenylene sulfide-based resin, or benzocyclobutene (BCB).

The light emitting element layer EML may be disposed on the fourth insulating layer IL4. The light emitting element layer EML may include light emitting elements and a pixel defining layer BANK.

The light emitting element may be an organic light emitting element. In this case, the light emitting element may include a first electrode ANO, a light emitting layer EL, and a second electrode CAT.

The first electrode ANO may be disposed on the fourth insulating layer IL4. The first electrode ANO may be coupled to the drain electrode 132 of the thin film transistor through the contact hole formed through the fourth insulating layer IL4.

The first electrode ANO may have a stacked structure formed by stacking a material layer having a high work function such as Indium-Tin-Oxide (ITO), Indium-Zinc-Oxide (IZO), Zinc Oxide (ZnO), or Induim Oxide (In2O3), and a reflective material layer, such as silver (Ag), Magnesium (Mg), aluminum (Al), platinum (Pt), lead (Pb), gold (Au), nickel (Ni), neodium (Nd), iridium (Ir), chromium (Cr), lithium (Li), Calcium (Ca) or a mixture thereof.

The pixel defining layer BANK may be disposed on the first electrode ANO. The pixel defining layer BANK may be disposed on the fourth insulating layer IL4 to cover an edge of the first electrode ANO so as to partition an emission region of the pixels.

The pixel defining layer BANK may include an inorganic insulating material such as silicon oxide, silicon nitride, silicon oxynitride, hafnium oxide, aluminum oxide, titanium oxide, tantalum oxide, or zinc oxide, or organic insulating material, such as polyacrylate-based resin, epoxy resin, phenolic resin, polyamide-based resin, polyimide-based resin, unsaturated polyester-based resin, polyphenylen ether-based resin, polyphenylene sulfide-based resin, or benzocyclobutene (BCB).

The light emitting layer EL may be disposed on the first electrode ANO and the pixel defining layer BANK. The light emitting layer EL may be an organic light emitting layer. The light emitting layer EL may emit one of red light, green light, and blue light. Alternatively, the light emitting layer EL may be a white light emitting layer that emits white light. In this case, the white light emitting layer may have a structure in which a red light emitting layer, a green light emitting layer, and a blue light emitting layer are stacked, and may be a common layer that is formed in common on the pixels. In this case, the display panel DSP may further include a separate color filter for displaying red, green, and blue.

The light emitting layer EL may include a hole transporting layer, a light emitting layer, and an electron transporting layer. Furthermore, the light emitting layer EL may be formed in a tandem structure having two or more stacks. In this case, a charge generating layer may be formed between the stacks.

The second electrode CAT may be disposed on the light emitting layer EL. The second electrode CAT may be disposed to cover the light emitting layer EL. The second electrode CAT may be a common layer that is formed in common on the pixels. The second electrode CAT may include a material layer having a small work function, such as Li, Ca, LiF/Ca, LiF/Al, Al, Mg, Ag, Pt, Pd, Ni, Au Nd, Ir, Cr, BaF, Ba, compounds or mixtures (e.g. mixture of Ag and Mg) thereof. The second electrode CAT may further include a transparent metal oxide layer disposed on the material layer having the small work function.

The second electrode CAT may be disposed on the front surface of the display area DA of the substrate SUB, and may be omitted in the non-display area NDA in which the fan-out line FL and the sensing connection line SSL are disposed. In other words, the fan-out line FL and the sensing connection line SSL may not overlap with the second electrode CAT.

The thin film encapsulation layer TFEL may be disposed on the second electrode CAT. The thin film encapsulation layer TFEL may serve to prevent oxygen or moisture from penetrating the light emitting layer EL and the second electrode CAT. To accomplish this, the thin film encapsulation layer TFEL may include at least one inorganic layer. The inorganic layer may be formed of silicon nitride, aluminum nitride, zirconium nitride, titanium nitride, hafnium nitride, tantalum nitride, silicon oxide, aluminum oxide, or titanium oxide.

Furthermore, the thin film encapsulation layer TFEL may include at least one organic layer. The organic layer may have a thickness sufficient to prevent particles from penetrating the thin film encapsulation layer TFEL and entering the light emitting layer EL and the second electrode CAT. The organic layer may include any one of epoxy, acrylate, or urethane acrylate.

The thin film encapsulation layer TFEL may be disposed on the front surface of the display area DA of the substrate SUB, and may be omitted in the non-display area NDA in which the fan-out line FL and the sensing connection line SSL are disposed. In other words, the fan-out line FL and the sensing connection line SSL may not overlap with the thin film encapsulation layer TFEL.

The sensing layer TSL may be disposed on the thin film encapsulation layer TFEL. The configuration in which the sensing layer TSL is directly disposed on the thin film encapsulation layer TFEL can reduce the thickness of the display device, as compared to the configuration in which a separate touch panel including the sensing layer TSL is attached to the thin film encapsulation layer TFEL.

The sensing layer TSL may include a sensing insulating layer SIL, a sensing conductive layer SCL, and a sensing protection layer SPVX.

Each of the above-described layers may be formed of a single-layer structure, but may also be formed of a stacked-layer structure including a plurality of layers. Another layer may be further disposed between the respective layers.

The sensing insulating layer SIL may be disposed on the thin film encapsulation layer TFEL. The sensing insulating layer SIL may serve to prevent cracks from occurring and improve sensing sensitivity. Furthermore, the sensing insulating layer SIL, as well as the encapsulation layer TFEL, may serve to prevent oxygen or moisture from penetrating the light emitting element layer EML.

The sensing conductive layer SCL may be disposed on the sensing insulating layer SIL. The sensing conductive layer SCL may include molybdenum, titanium, copper, aluminum, and an alloy of them. The sensing conductive layer SCL may include a plurality of sensing electrodes SE sensing a user's touch, and a sensing connection line SSL coupling each sensing electrode SE with the sensing pad.

The sensing protection layer SPVX is disposed on the sensing conductive layer SCL. The sensing protection layer SPVX may be disposed on the front surface of the substrate SUB to cover the sensing conductive layer SCL. The sensing protection layer SPVX may serve to insulate the sensing conductive layer SCL. The sensing protection layer SPVX may be in direct contact with the sensing insulating layer SIL.

The sensing protection layer SPVX may include an organic layer and/or an inorganic layer. For example, the organic layer may include at least one of acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin. For example, the inorganic layer may include at least one of aluminum oxide, titanium oxide, silicon oxide, silicon oxynitride, zirconium oxide, and hafnium oxide.

As described above, when the multiplexer MUX is disposed in the space between the sensing pads SP1 and SP2, an additional space for disposing the multiplexer MUX on the lower end of the display panel DSP may not be required. Therefore, the non-display area NDA of the display device 1000, namely, the dead space can be minimized.

Hereinafter, an embodiment will be described. In the following embodiment, the same components as those already described will be denoted by the same reference numerals, and duplicated descriptions will be omitted or simplified.

Figure 11:
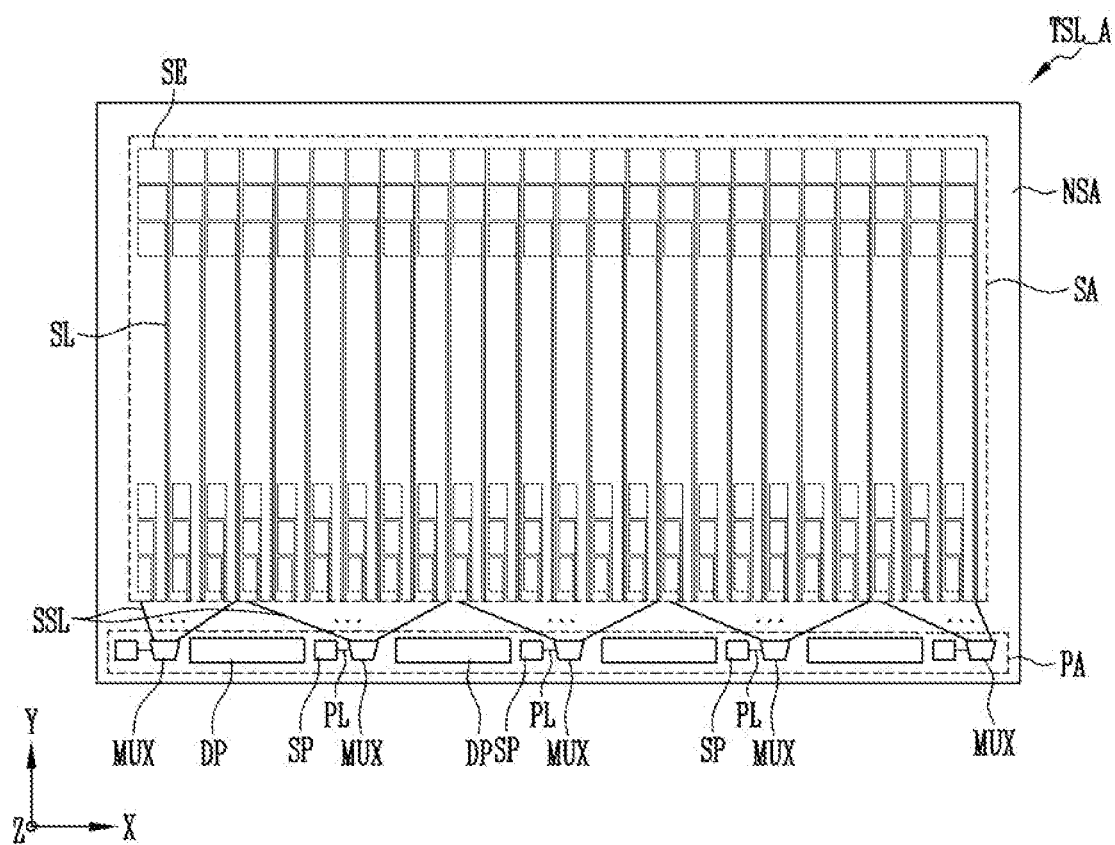
FIG. 11 is a plan view illustrating a sensing layer in accordance with another embodiment.

FIG. 11 is a plan view illustrating a sensing layer in accordance with another embodiment.

Referring to FIG. 11, a sensing layer TSL_A in accordance with this embodiment is different from that of the embodiment illustrated in FIGS. 1 to 10 in that the multiplexer MUX is disposed in the space between the sensing pad SP and the display pad DP.

More specifically, the multiplexer MUX may be disposed in the space between the plurality of pads DP and SP on the pad region PA. For example, the sensing pad SP may be disposed in the space between the plurality of display pads DP, and the multiplexer MUX may be disposed in the space between the sensing pad SP and the display pad DP. In other words, the sensing pad SP may be disposed on one side of the multiplexer MUX, and the display pad DP may be disposed on the other side of the multiplexer MUX. For example, the multiplexer MUX may be adjacent to the display pad DP in the first direction (X-axis direction). Furthermore, the multiplexer MUX may be adjacent to the sensing pad SP in the opposite direction of the first direction (X-axis direction). That is, the multiplexer MUX may be disposed on the same line as the sensing pad SP and the display pad DP along the first direction (X-axis direction).

As described above, when the multiplexer MUX is disposed in the space between the sensing pad SP and the display pad DP, an additional space for disposing the multiplexer MUX on the lower end of the display panel DSP may not be required. Therefore, as described above, the non-display area NDA of the display device, namely, the dead space, can be minimized.

The multiplexer MUX and the sensing pad SP may be electrically coupled via the pad line PL. The multiplexer MUX may couple at least one of the sensing connection lines SSL to the pad line PL in response to a sensing control signal.

As the sensing connection line SSL and the pad line PL are coupled to each other by the multiplexer MUX, the number of the pad lines PL may be less than the number of the sensing connection lines SSL. That is, the numbers of the pad line PL and the sensing pad SP coupled to the pad line PL can be minimized due to the multiplexer MUX. Therefore, as described above, since the additional space for disposing the sensing pad SP is required, the non-display area NDA of the display device, namely, the dead space can be minimized.

Meanwhile, FIG. 11 illustrates an example in which the multiplexer MUX is adjacent to the display pad DP in the first direction (X-axis direction), and is adjacent to the sensing pad SP in the opposite direction of the first direction (X-axis direction), but the inventive concepts are not limited thereto. In other words, as long as the multiplexer MUX, the sensing pad SP, and the display pad DP may be disposed on the same line, the arrangement sequence of the multiplexer MUX, the sensing pad SP, and the display pad DP may be variously changed. For example, the multiplexer MUX may be adjacent to the display pad DP in the opposite direction of the first direction (X-axis direction). Furthermore, the multiplexer MUX may be adjacent to the sensing pad SP in the first direction (X-axis direction).

Since other configurations related to the sensing layer TSL_A may be substantially equal or similar to the configuration of the sensing layer TSL described with reference to FIG. 6, duplicate descriptions thereof are omitted.

Figure 12:
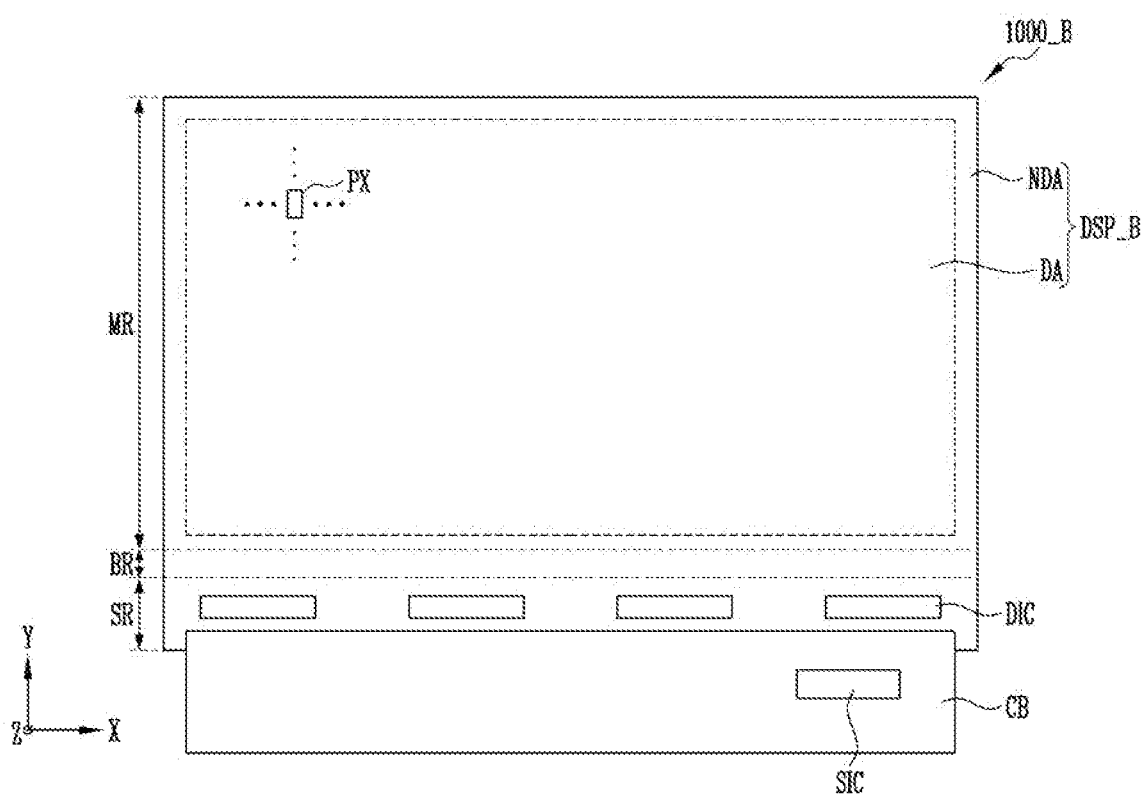
FIG. 12 is a plan view illustrating a display device in accordance with another embodiment.
Figure 13:
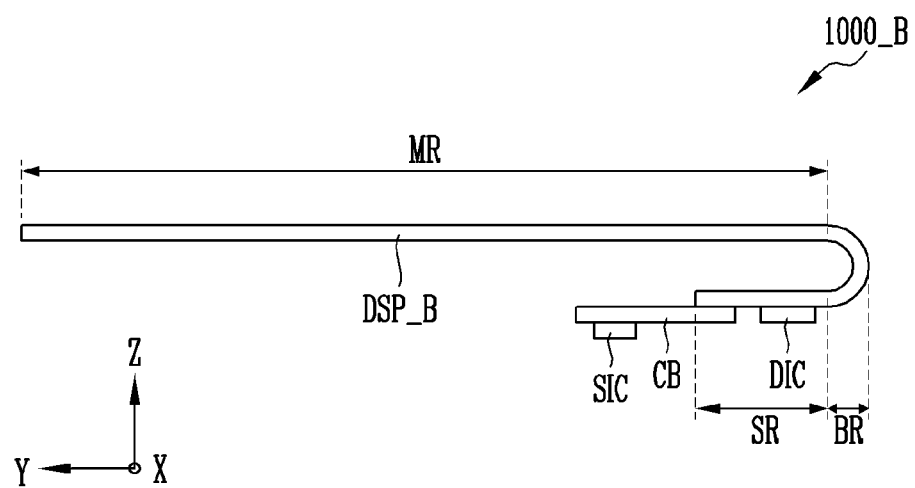
FIG. 13 is a side view illustrating the display device of FIG. 12.

FIG. 12 is a plan view illustrating a display device in accordance with another embodiment. FIG. 13 is a side view illustrating the display device of FIG. 12.

Referring to FIGS. 12 and 13, the display device 1000_B in accordance with this embodiment is different from that of the embodiment illustrated in FIGS. 1 to 10 in that the display device includes a bending area BR.

To be more specific, a display panel DSP_B may include the bending area BR in which the panel is bent, a main area MR located on one side of the bending area BR, and a sub-area SR extending from the other side of the bending area BR.

The main area MR may have a shape similar to a planar appearance of the display device 1000_B. The main area MR may be a flat region located on a surface.

The main area MR may include a display area DA. A non-display area NDA may be disposed around the display area DA of the main area MR.

Signal lines or drive circuits for applying a signal to the display area DA may be disposed in the non-display area NDA of the main area MR. Furthermore, the outermost black matrix may be disposed in the non-display area NDA of the main area MR, but the inventive concepts are not limited thereto.

The bending area BR is coupled to the main area MR. For instance, the bending area BR may be coupled through one short side of the main area MR. The display panel DSP_B may be bent in the bending area BR while having a curvature in an opposite direction of the third direction (Z-axis direction), that is, in an opposite direction of the display surface. As the display panel DSP_B is bent in the bending area BR, a surface of the display panel DSP_B may be inverted. In other words, one surface facing upward may be changed to face outwards through the bending area BR and then face downwards again.

The sub-area SR may extend from the bending area BR. The bent sub-area SR may be substantially parallel to the main area MR. The bent sub-area SR may overlap with the main area MR in the third direction (Z-axis direction) of the display panel DSP_B. The bent sub-area SR may overlap with the non-display area NDA along an edge of the main area MR, and further may overlap with the display area DA of the main area MR.

The sub-area SR may be a region in which a display drive circuit DIC is provided. The display drive circuit DIC may be formed as an integrated circuit (IC), and may be disposed on the sub-area SR in a chop on glass (COG) method, a chip on plastic (COP) method, or an ultrasonic bonding method. However, the inventive concepts are not limited thereto. As another example, the display drive circuit DIC may be mounted on a circuit board CB. Since other configurations of the display drive circuit DIC have been described with reference to FIG. 2, duplicated description thereof is omitted.

A circuit board CB may be attached to a second end of the sub-area SR. The circuit board CB may be a flexible printed circuit board (FPCB), a printed circuit board (PCB), or a flexile film such, as a chip-on-film (COF). The circuit board CB may be a region in which a sensing drive circuit SIC is provided.

The sensing drive circuit SIC may be disposed on the circuit board CB. For example, the sensing drive circuit SIC may be formed as an integrated circuit IC to be mounted on the circuit board CB. Since other configurations of the sensing drive circuit SIC have been described with reference to FIG. 2, duplicate descriptions thereof are omitted.

Figure 14:
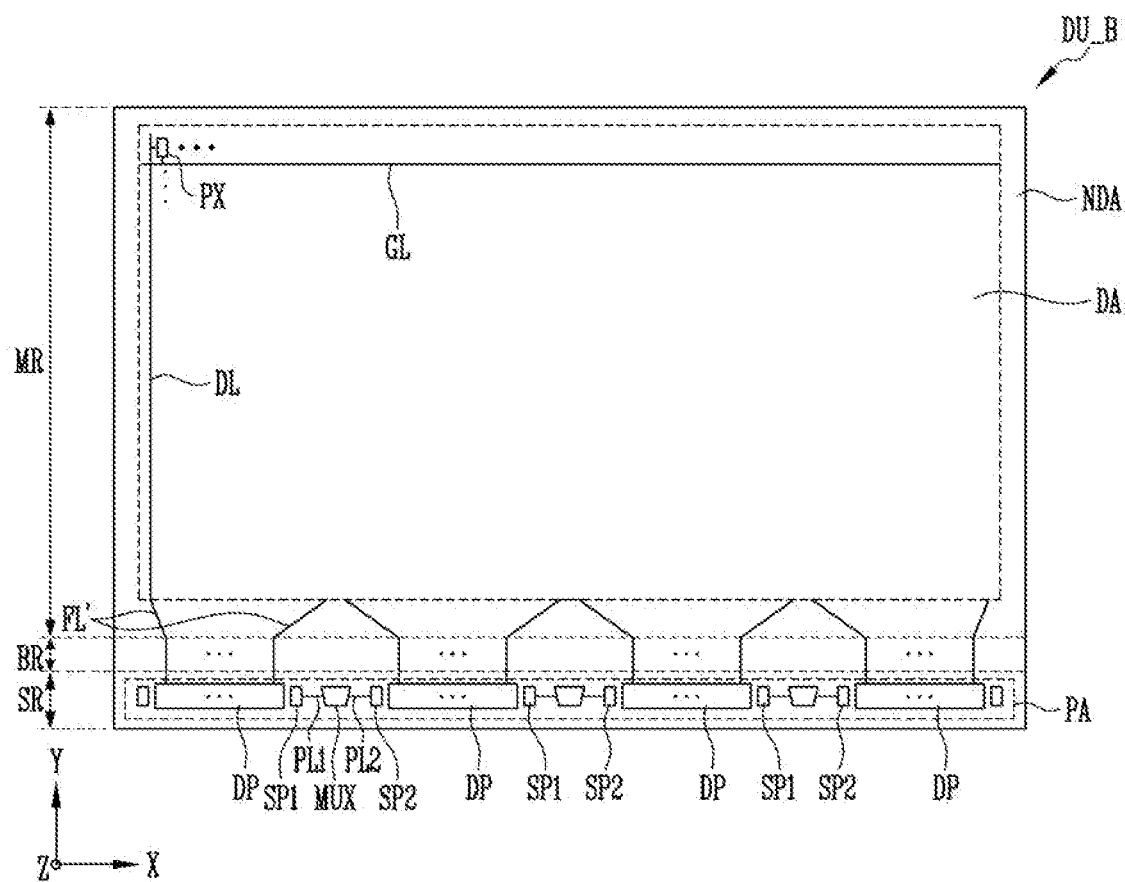
FIG. 14 is a plan view illustrating a configuration related to a display unit of a display panel of FIG. 13.

FIG. 14 is a plan view illustrating a configuration related to a display unit of a display panel of FIG. 13.

Referring to FIG. 14, a plurality of pixels PX, scan lines GL, and data lines DL may be disposed on the display area DA of the main area MR. The scan lines GL may be coupled to the gate driver GDR to be formed in parallel with the first direction (X-axis direction). The data lines DL may be coupled to the data driver DDR to be formed in parallel with the second direction (Y-axis direction). Each of the pixels PX may be coupled to at least one of the scan lines GL and any one of the data lines DL.

A pad region PA may be disposed on the sub-area SR. A plurality of display pads DP and sensing pads SP1 and SP2 may be disposed in the pad region PA.

The plurality of display pads DP may be disposed in the first direction (X-axis direction) on the pad region PA. The plurality of display pads DP may be electrically coupled to the display drive circuit DIC. The display drive circuit DIC may convert digital video data into analog data voltages to supply the voltages through a fan-out line FL' to the data line DL.

The fan-out line FL' may be disposed in the non-display area NDA. The fan-out line FL' may extend from the display pad DP through the sub-area SR, the bending area BR, and the non-display area NDA of the main area MR to a boundary between the display area DA and the non-display area NDA. The fan-out lines FL' may extend in the bending area BR in the second direction (Y-axis direction), and may be sequentially arranged at a specific interval in the first direction (X-axis direction). A first end of the fan-out line FL' may be electrically coupled to the data line DL, while a second end of the fan-out line FL' may be electrically coupled to the display pad DP.

Figure 15:
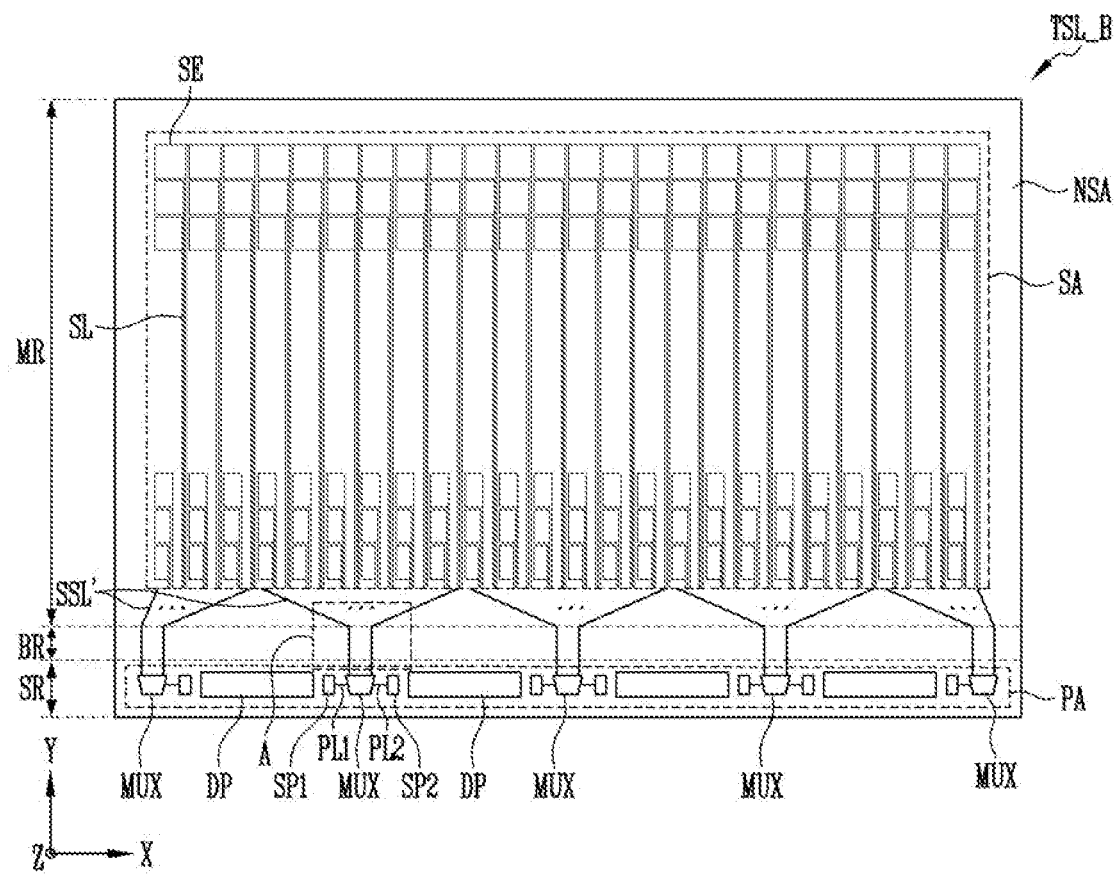
FIG. 15 is a plan view illustrating a configuration related to a sensing layer stacked on the display unit of FIG. 14.

FIG. 15 is a plan view illustrating a configuration related to a sensing layer stacked on the display unit of FIG. 14.

Referring to FIG. 15, the sensing layer TSL_B may include a sensing region SA that may sense a user's touch, and a non-sensing region NSA excluding the sensing region SA. The sensing region SA may overlap with the display area DA of the main area MR.

A plurality of sensing lines SL coupled to the plurality of sensing electrodes SE may be disposed in the sensing region SA.

The sensing electrodes SE may be coupled to the sensing pads SP1 and SP2. To be more specific, the sensing electrodes SE may be electrically coupled to first ends of the sensing lines SL, and second ends of the sensing lines SL may be electrically coupled to sensing connection lines SSL'. The sensing connection lines SSL' may be coupled to pad lines PL1 and PL2 by a multiplexer MUX, and the pad lines PL1 and PL2 may be coupled to the sensing pads SP1 and SP2. Therefore, the sensing electrodes SE may be coupled through the sensing lines SL, the sensing connection lines SSL', the multiplexer MUX, and the pad lines PL1 and PL2 to the sensing pads SP1 and SP2, and consequently coupled to the sensing drive circuit SIC.

The first end of each of the sensing lines SL may be electrically coupled to the sensing electrode SE, while the second end of each of the sensing lines SL may be electrically coupled to the sensing connection line SSL'. The sensing lines SL may extend in the second direction (Y-axis direction) on the sensing region SA.

Each of the sensing lines SL may be electrically coupled to the first end of the sensing connection line SSL'. The second end of the sensing connection line SSL' may be electrically coupled to the multiplexer MUX.

The sensing connection line SSL' may be disposed in the non-sensing region NSA. The sensing connection line SSL' may extend from the multiplexer MUX through the sub-area SR, the bending area BR, and the non-display area NDA of the main area MR to a boundary between a sensing region SA and a non-sensing region NSA. The sensing connection lines SSL' may extend in the bending area BR in the second direction (Y-axis direction), and may be sequentially arranged at a specific interval in the first direction (X-axis direction). The sensing connection line SSL' will be described below in detail with reference to FIGS. 16 and 17.

The sensing connection line SSL' may serve to couple the sensing line SL and the sensing pads SP1 and SP2. The first end of the sensing connection line SSL' may be electrically coupled to the sensing line SL, while the second end of the sensing connection line SSL' may be electrically coupled to the pad lines PL1 and PL2 by the multiplexer MUX.

The multiplexer MUX may couple at least one of the sensing connection lines SSL' to the pad lines PL1 and PL2 in response to a sensing control signal. As the sensing connection line SSL' and the pad lines PL1 and PL2 are coupled to each other by the multiplexer MUX, the number of the pad lines PL1 and PL2 may be less than the number of the sensing connection lines SSL'. That is, the numbers of the pad lines PL1 and PL2 and the sensing pads SP1 and SP2 coupled to the pad lines PL1 and PL2 can be minimized due to the multiplexer MUX. Thus, as described above, since an additional space for arranging the sensing pads is not required, the non-display area NDA of the display device 1000_B, namely, a dead space can be minimized.

The multiplexer MUX may be disposed in the space between the plurality of pads DP, SP1, and SP2 on the pad region PA. For instance, the first sensing pad SP1 and the second sensing pad SP2 may be disposed in the space between the display pads DP, and the multiplexer MUX may be disposed in the space between the first sensing pad SP1 and the second sensing pad SP2. For instance, the multiplexer MUX may be disposed on the same line as the sensing pads SP1 and SP2 in the first direction (X-axis direction).

As described above, when the multiplexer MUX is disposed in the space between the sensing pads SP1 and SP2, an additional space for disposing the multiplexer MUX on the lower end of the display panel DSP_B may not be required. Therefore, as described above, the non-display area NDA of the display device 1000_B, namely, the dead space can be minimized.

Hereinafter, the arrangement relationship between the sensing connection line SSL' and the fan-out line FL' in the bending area BR will be described in detail with reference to FIGS. 16 and 17.

Figure 16:
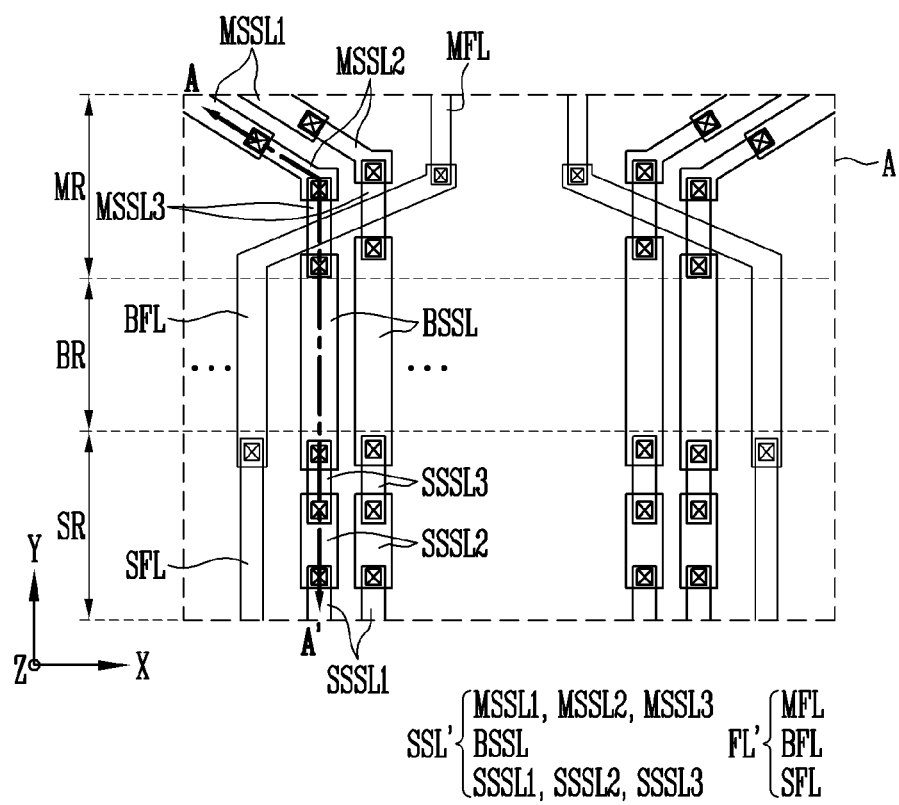
FIG. 16 is an enlarged view of region A of FIG. 15.

FIG. 16 is an enlarged view of region A of FIG. 15. FIG. 17 is a sectional view taken along line A-A' of FIG. 16.

Figure 17:
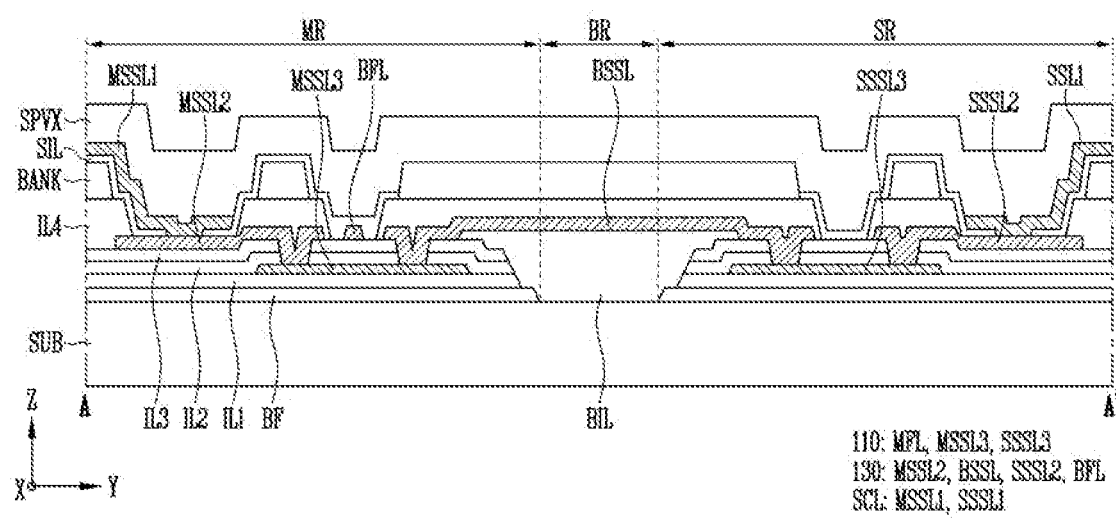
FIG. 17 is a sectional view taken along line A-A' of FIG. 16.

Referring to FIGS. 16 and 17, a plurality of sensing connection lines SSL' each may include main sensing connection lines MSSL1, MSSL2, and MSSL3, sub-sensing connection lines SSSL1, SSSL2, and SSSL3 spaced apart from the main sensing connection lines MSSL1, MSSL2, and MSSL3, and a bending sensing connection line BSSL coupling the main sensing connection lines MSSL1, MSSL2, and MSSL3 and the sub-sensing connection lines SSSL1, SSSL2, and SSSL3.

The main sensing connection lines MSSL1, MSSL2, and MSSL3 may be disposed in the non-display area NDA of the main area MR. The main sensing connection lines MSSL1, MSSL2, and MSSL3 may include first-to-third main sensing connection lines MSSL1, MSSL2, and MSSL3.

A first end of the first main sensing connection line MSSL1 may be electrically coupled to the sensing line SL, and a second end of the first main sensing connection line MSSL1 may be electrically coupled to the second main sensing connection line MSSL2.

A first end of the second main sensing connection line MSSL2 may be electrically coupled to the first main sensing connection line MSSL1, and a second end of the second main sensing connection line MSSL2 may be electrically coupled to the third main sensing connection line MSSL3. The second main sensing connection line MSSL2 may serve to couple the first main sensing connection line MSSL1 and the third main sensing connection line MSSL3 that are spaced apart from each other.

A first end of the third main sensing connection line MSSL3 may be electrically coupled to the second main sensing connection line MSSL2, and a second end of the third main sensing connection line MSSL3 may be electrically coupled to the bending sensing connection line BSSL.

The first-to-third main sensing connection lines MSSL1, MSSL2, and MSSL3 may be formed of different conductive layers.

For instance, as illustrated in FIG. 17, the first main sensing connection line MSSL1 may be formed of a sensing conductive layer SCL. The first main sensing connection line MSSL1 may be in contact with the second main sensing connection line MSSL2 through a contact hole that is formed through the sensing insulating layer SIL.

The second main sensing connection line MSSL2 may be formed of a third conductive layer 130. The second main sensing connection line MSSL2 may be in contact with the third main sensing connection line MSSL3 through a contact hole that is formed through the second insulating layer IL2 and the third insulating layer IL3.

The third main sensing connection line MSSL3 may be formed of a first conductive layer 110. The third main sensing connection line MSSL3 may be in contact with the bending sensing connection line BSSL through a contact hole that is formed through the second insulating layer IL2 and the third insulating layer IL3.

The sub-sensing connection lines SSSL1, SSSL2, and SSSL3 may be disposed in the sub-area SR. The sub-sensing connection lines SSSL1, SSSL2, and SSSL3 may be disposed to be spaced apart from the main sensing connection lines MSSL1, MSSL2, and MSSL3. The sub-sensing connection lines SSSL1, SSSL2, and SSSL3 may be electrically coupled to the main sensing connection lines MSSL1, MSSL2, and MSSL3 by the bending sensing connection line BSSL.

The sub-sensing connection lines SSSL1, SSSL2, and SSSL3 may include first-to-third sub-sensing connection lines SSSL1, SSSL2, and SSSL3.

A first end of the first sub-sensing connection line SSSL1 may be electrically coupled to the sensing pads SP1 and SP2, and a second end of the first sub-sensing connection line SSSL1 may be electrically coupled to the second sub-sensing connection line SSSL2.

A first end of the second sub-sensing connection line SSSL2 may be electrically coupled to the first sub-sensing connection line SSSL1, and a second end of the second sub-sensing connection line SSSL2 may be electrically coupled to the third sub-sensing connection line SSSL3. The second sub-sensing connection line SSSL2 may serve to couple the first sub-sensing connection line SSSL1 and the third sub-sensing connection line SSSL3 that are spaced apart from each other.

A first end of the third sub-sensing connection line SSSL3 may be electrically coupled to the second sub-sensing connection line SSSL2, and a second end of the third sub-sensing connection line SSSL3 may be electrically coupled to the bending sensing connection line BSSL.

The first-to-third sub-sensing connection lines SSSL1, SSSL2, and SSSL3 may be formed of different conductive layers.

For instance, as illustrated in FIG. 17, the first sub-sensing connection line SSSL1 may be formed of the sensing conductive layer SCL. The first sub-sensing connection line SSSL1 may be in contact with the second sub-sensing connection line SSSL2 through the contact hole that is formed through the sensing insulating layer SIL.

The second sub-sensing connection line SSSL2 may be formed of the third conductive layer 130. The second sub-sensing connection line SSSL2 may be in contact with the third sub-sensing connection line SSSL3 through the contact hole that is formed through the second insulating layer IL2 and the third insulating layer IL3.

The third sub-sensing connection line SSSL3 may be formed of the first conductive layer 110. The third sub-sensing connection line SSSL3 may be in contact with the bending sensing connection line BSSL through the contact hole that is formed through the second insulating layer IL2 and the third insulating layer IL3.

The bending sensing connection line BSSL may be disposed in the bending area BR. The bending sensing connection lines BSSL may extend in the second direction (Y-axis direction), and may be sequentially arranged at a specific interval in the first direction (X-axis direction).

A first end of the bending sensing connection line BSSL may extend to the non-display area NDA of the main area MR to be coupled to the above-described main sensing connection lines MSSL1, MSSL2, and MSSL3. A second end of the bending sensing connection line BSSL may extend to the sub-area SR to be coupled to the above-described sub-sensing connection lines SSSL1, SSSL2, and SSSL3. To be more specific, a first end of the bending sensing connection line BSSL may be electrically coupled to the third main sensing connection line MSSL3, and a second end of the bending sensing connection line BSSL may be electrically coupled to the third sub-sensing connection line SSSL3.

The bending sensing connection line BSSL may be formed of a conductive layer different from those of the third main sensing connection line MSSL3 and the third sub-sensing connection line SSSL3.

For instance, as illustrated in FIG. 17, the bending sensing connection line BSSL may be formed of the third conductive layer 130. The first end of the bending sensing connection line BSSL may be in contact with the third main sensing connection line MSSL3 formed of the first conductive layer 110 through the contact hole that is formed through the second insulating layer IL2 and the third insulating layer IL3. The second end of the bending sensing connection line BSSL may be in contact with the third sub-sensing connection line SSSL3 formed of the first conductive layer 110 through the contact hole that is formed through the second insulating layer IL2 and the third insulating layer IL3.

The buffer layer BF, the first insulating layer IL1, the second insulating layer IL2, and/or the third insulating layer IL3 may be omitted in the bending area BR. That is, the buffer layer BF, the first insulating layer IL1, the second insulating layer IL2, and/or the third insulating layer IL3 may be partially eliminated in the bending area BR to expose the surface of the substrate SUB. A bending insulating layer BIL may be further disposed in an opening formed by eliminating the buffer layer BF, the first insulating layer IL1, the second insulating layer IL2, and/or the third insulating layer IL3.

The bending insulating layer BIL may be disposed in the bending area BR, and may be partially extended to the main area MR and/or the sub-area SR. The bending insulating layer BIL may be disposed between the substrate SUB and the bending sensing connection line BSSL.

The bending insulating layer BIL may include organic insulating material, such as polyacrylate-based resin, epoxy resin, phenolic resin, polyamide-based resin, polyimide-based resin, unsaturated polyesters resin, polyphenylen ether-based resin, polyphenylene sulfide-based resin, or benzocyclobutene (BCB).

The plurality of fan-out lines FL' each may include a main fan-out line MFL, a sub fan-out line SFL spaced apart from the main fan-out line MFL, and a bending fan-out line BFL coupling the main fan-out line MFL and the sub fan-out line SFL.

The main fan-out line MFL may be disposed in the non-display area NDA of the main area MR. A first end of the main fan-out line MFL may be electrically coupled to the data line DL, while a second end of the main fan-out line MFL may be electrically coupled to the bending fan-out line BFL.

The sub fan-out line SFL may be disposed in the sub-area SR. The sub fan-out line SFL may be disposed to be spaced apart from the main fan-out line MFL. The sub fan-out line SFL may be electrically coupled to the main fan-out line MFL by the bending fan-out line BFL.

A first end of the sub fan-out line SFL may be electrically coupled to the display pad DP, while a second end of the sub fan-out line SFL may be electrically coupled to the bending fan-out line BFL.

The bending fan-out line BFL may be disposed in the bending area BR. The bending fan-out lines BFL may extend in the second direction (Y-axis direction), and may be sequentially arranged at a specific interval in the first direction (X-axis direction).

A first end of the bending fan-out line BFL may extend to the non-display area NDA of the main area MR to be coupled to the above-described main fan-out line MFL. A second end of the bending fan-out line BFL may extend to the sub-area SR to be coupled to the above-described sub fan-out line SFL.

The bending fan-out line BFL may intersect to partially overlap with the sensing connection line SSL'. For instance, the bending fan-out line BFL may intersect to partially overlap with the third main sensing connection line MSSL3. The bending fan-out line BFL may be formed of a conductive layer different from that of the third main sensing connection line MSSL3. For instance, as illustrated in FIG. 17, the bending fan-out line BFL may be formed of the third conductive layer 130, and the third main sensing connection line MSSL3 may be formed of the first conductive layer 110. The bending fan-out line BFL and the third main sensing connection line MSSL3 may be insulated by the second insulating layer IL2 and/or the third insulating layer IL3.

Meanwhile, FIGS. 16 and 17 illustrate an example in which the bending fan-out line BFL intersects to overlap with the third main sensing connection line MSSL3, but the inventive concepts are not limited thereto. For instance, the bending fan-out line BFL may intersect to overlap with the first main sensing connection line MSSL1 or the second main sensing connection line MSSL2. In this case, the bending fan-out line BFL may be formed of a conductive layer different from that of the first main sensing connection line MSSL1 or the second main sensing connection line MSSL2.

Figure 18:
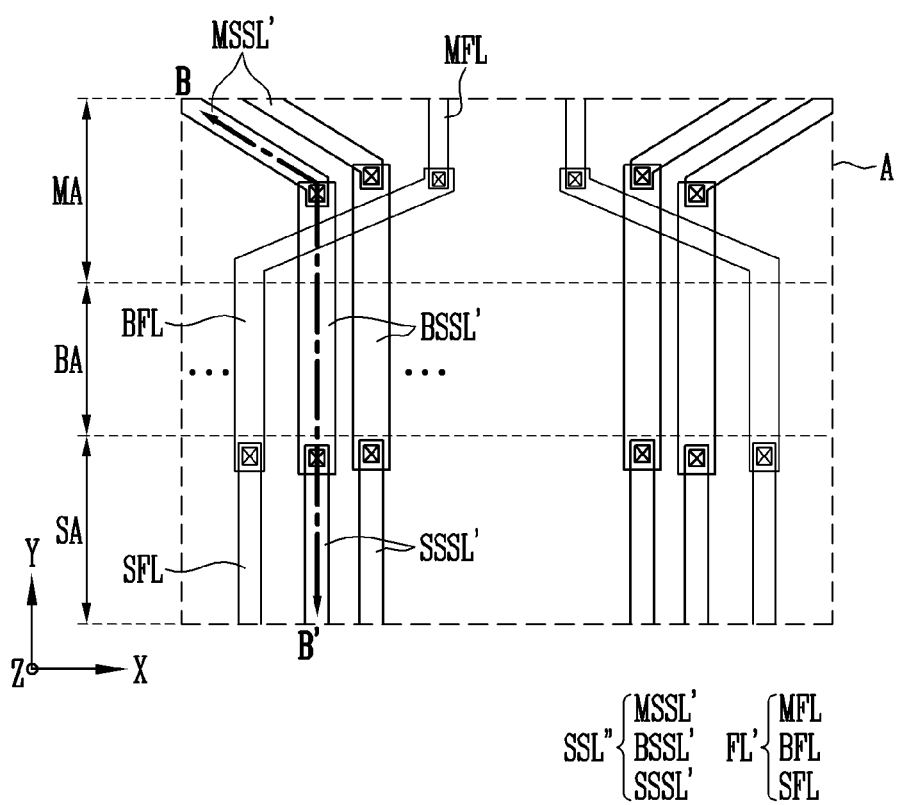
FIG. 18 is an enlarged view of region A in accordance with another embodiment.
Figure 19:
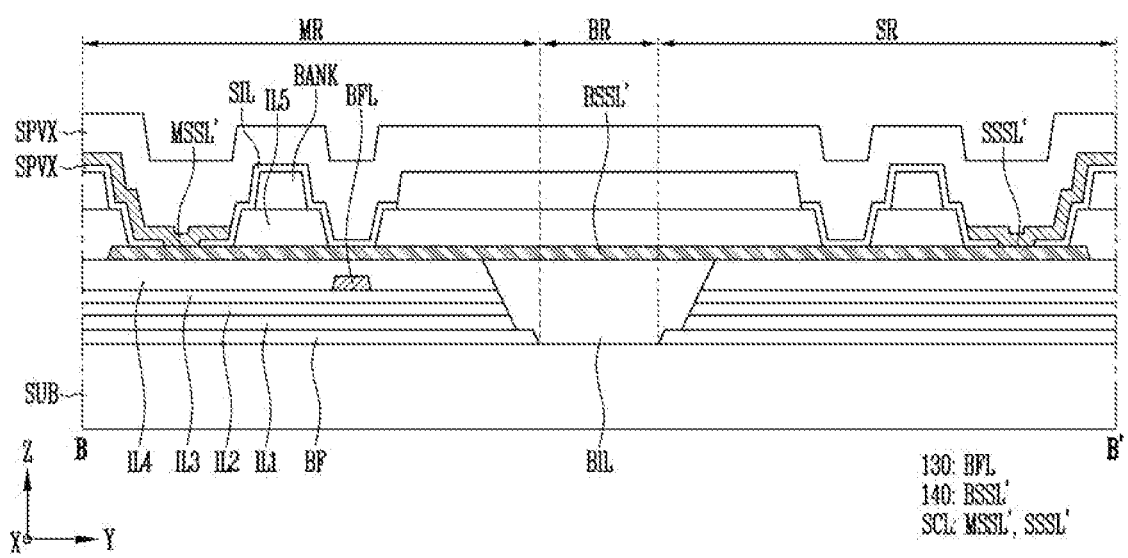
FIG. 19 is a sectional view taken along line B-B' of FIG. 18.

FIG. 18 is an enlarged view of region A in accordance with another embodiment. FIG. 19 is a sectional view taken along line B-B' of FIG. 18.

Referring to FIGS. 18 and 19, the display device in accordance with this embodiment is different from the embodiment of FIGS. 16 and 17 in that a fourth conductive layer 140 and a fifth insulating layer IL5 are further included, and the bending sensing connection line BSSL' is formed of a fourth conductive layer 140.

A plurality of sensing connection lines SSL'' each may include a main sensing connection line MSSL', a sub-sensing connection line SSSL' spaced apart from the main sensing connection line MSSL', and a bending sensing connection line BSSL' coupling the main sensing connection line MSSL' and the sub-sensing connection line SSSL'.

The main sensing connection line MSSL' may be disposed in the non-display area NDA of the main area MR. A first end of the main sensing connection line MSSL' may be electrically coupled to the sensing line SL, and a second end of the main sensing connection line MSSL' may be electrically coupled to the bending sensing connection line BSSL'.

The sub-sensing connection line SSSL' may be disposed in the sub-area SR. The sub-sensing connection line SSSL' may be disposed to be spaced apart from the main sensing connection line MSSL'. The sub-sensing connection line SSSL' may be electrically coupled to the main sensing connection line MSSL' by the bending sensing connection line BSSL'.

A first end of the sub-sensing connection line SSSL' may be electrically coupled to the sensing pads SP1 and SP2, and a second end of the sub-sensing connection line SSSL' may be electrically coupled to the bending sensing connection line BSSL'.

The bending sensing connection line BSSL' may be disposed in the bending area BR. The bending sensing connection lines BSSL' may extend in the second direction (Y-axis direction), and may be sequentially arranged at a specific interval in the first direction (X-axis direction).

A first end of the bending sensing connection line BSSL' may extend to the non-display area NDA of the main area MR to be coupled to the above-described main sensing connection line MSSL'. A second end of the bending sensing connection line BSSL' may extend to the sub-area SR to be coupled to the above-described sub-sensing connection line SSSL'.

The bending sensing connection line BSSL' may be formed of a conductive layer different from those of the main sensing connection line MSSL' and the sub-sensing connection line SSSL'.

For instance, as illustrated in FIG. 19, the bending sensing connection line BSSL' may be formed of the fourth conductive layer 140.

The fourth conductive layer 140 may be disposed on the fourth insulating layer IL4. The fourth conductive layer 140 may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The fourth conductive layer 140 may be a single-layer structure or a multi-layer structure. For example, the fourth conductive layer 140 may be formed of a stacked structure, such as Ti/Al/Ti, Mo/Al/Mo, Mo/AlGe/Mo, or Ti/Cu.

The fifth insulating layer IL5 may be disposed on the fourth conductive layer 140. The fifth insulating layer IL5 may be a via layer. The fifth insulating layer IL5 may include organic insulating material, such as polyacrylate-based resin, epoxy resin, phenolic resin, polyamide-based resin, polyimide-based resin, unsaturated polyesters resin, polyphenylen ether-based resin, polyphenylene sulfide-based resin, or benzocyclobutene (BCB).

The first end of the bending sensing connection line BSSL' may be in contact with the main sensing connection line MSSL' formed of the sensing conductive layer SCL through the contact hole that is formed through the sensing insulating layer SIL. The second end of the bending sensing connection line BSSL' may be in contact with the sub-sensing connection line SSSL' formed of the sensing conductive layer SCL through the contact hole that is formed through the sensing insulating layer SIL.

The buffer layer BF, the first insulating layer ILL the second insulating layer IL2, the third insulating layer IL3, and/or the fourth insulating layer IL4 may be omitted in the bending area BR. That is, the buffer layer BF, the first insulating layer ILL the second insulating layer IL2, the third insulating layer IL3, and/or the fourth insulating layer IL4 may be partially eliminated in the bending area BR to expose the surface of the substrate SUB. A bending insulating layer BIL may be further disposed in an opening formed by eliminating the buffer layer BF, the first insulating layer ILL the second insulating layer IL2, the third insulating layer IL3, and/or the fourth insulating layer IL4.

The bending insulating layer BIL may be disposed in the bending area BR, and may be partially extended to the main area MR and/or the sub-area SR. The bending insulating layer BIL may be disposed between the substrate SUB and the bending sensing connection line BSSL'. Since the bending insulating layer BIL has been described with reference to FIG. 17, a duplicate description thereof is omitted herein.

The plurality of fan-out lines FL' may intersect to partially overlap with the sensing connection line SSL". For instance, the bending fan-out line BFL may intersect to partially overlap with the bending sensing connection line BSSL'. The bending fan-out line BFL may be formed of a conductive layer different from that of the bending sensing connection line BSSL'. For instance, as illustrated in FIG. 19, the bending fan-out line BFL may be formed of the third conductive layer 130, and the bending sensing connection line BSSL' may be formed of the fourth conductive layer 140. The bending fan-out line BFL and the bending sensing connection line BSSL' may be insulated by the fourth insulating layer IL4.

FIGS. 18 and 19 illustrate an example in which the bending fan-out line BFL intersects to overlap with the bending sensing connection line BSSL', but the inventive concepts are not limited thereto. For instance, the bending fan-out line BFL may intersect to overlap with the main sensing connection line MSSL'. In this case, the bending fan-out line BFL may be formed of a conductive layer different from that of the main sensing connection line MSSL'.

Since other components of the fan-out line FL' have been described with reference to FIGS. 16 and 17, duplicate descriptions thereof are omitted herein.

In a display device according to embodiments, a dead space of the display device can be minimized by disposing a multiplexer in a space between a plurality of pads.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a substrate comprising a display area including a plurality of pixels, and a non-display area adjacent to the display area;
   a plurality of sensing electrodes disposed to overlap with the display area;
   a plurality of display pads disposed along a first direction in the non-display area;
   a plurality of sensing pads disposed between the display pads; and
   a multiplexer electrically connecting the sensing electrodes and the sensing pads,
   wherein the multiplexer is adjacent to at least one of the sensing pads in the first direction.

2. The display device according to claim 1, wherein the plurality of sensing pads comprises a first sensing pad disposed on a first side of the display pad, and a second sensing pad disposed on a second side of the display pad.

3. The display device according to claim 2, wherein the multiplexer is disposed between the first sensing pad and the second sensing pad.

4. The display device according to claim 3, wherein the multiplexer is adjacent to the first sensing pad and the second sensing pad in the first direction.

5. The display device according to claim 4, further comprising:
   a first sensing pad line electrically connecting the first sensing pad and the multiplexer; and
   a second sensing pad line electrically connecting the second sensing pad and the multiplexer.

6. The display device according to claim 1, wherein the multiplexer is disposed between the sensing pad and the display pad.

7. The display device according to claim 6, wherein the multiplexer is adjacent to the sensing pad and the display pad in the first direction.

8. The display device according to claim 6, further comprising a plurality of fan-out lines electrically connecting the display pad and the pixel.

9. The display device according to claim 1, further comprising:
   a plurality of sensing connection lines electrically connecting the sensing electrodes and the multiplexer; and
   a plurality of pad lines electrically connecting the multiplexer and the sensing pads,
   wherein the number of the sensing connection lines is greater than the number of the pad lines.

10. The display device according to claim 1, wherein the substrate comprises:
    a bending area;
    a main area located on a first side of the bending area; and
    a sub-area extending from a second side of the bending area,
    wherein the multiplexer is disposed in the sub-area.

11. The display device according to claim 10, wherein the main area and the sub-area overlap with each other in a second direction.

12. The display device according to claim 10, further comprising:
    a plurality of sensing connection lines electrically connecting the sensing electrodes and the multiplexer,
    wherein each of the sensing connection lines comprises:
    a main sensing connection line disposed in the main area;
    a sub-sensing connection line disposed in the sub-area; and
    a bending sensing connection line disposed in the bending area, and electrically connecting the main sensing connection line and the sub-sensing connection line.

13. The display device according to claim 12, wherein the main sensing connection line comprises first-to-third main sensing connection lines formed of different conductive layers.

14. The display device according to claim 13, wherein the first main sensing connection line is formed of the same conductive layer as the sensing electrode.

15. The display device according to claim 13, wherein the second main sensing connection line is formed of the same conductive layer as the bending sensing connection line.

16. The display device according to claim 13, wherein a first end of the second main sensing connection line is in contact with the first main sensing connection line, and a second end of the second main sensing connection line is in contact with the third main sensing connection line.

17. The display device according to claim 13, wherein a first end of the third main sensing connection line is in contact with the second main sensing connection line, and a second end of the third main sensing connection line is in contact with the bending sensing connection line.

18. The display device according to claim 12, further comprising a plurality of fan-out lines electrically connecting the display pad and the pixel, wherein each of the fan-out lines comprises:

a main fan-out line disposed in the main area;

a sub fan-out line disposed in the sub-area; and a bending fan-out line electrically connecting the main fan-out line and the sub fan-out line.

19. The display device according to claim 18, wherein the bending sensing connection line and the bending fan-out line are formed of the same conductive layer.

20. The display device according to claim 18, wherein the bending fan-out line is formed of a first conductive layer, and the bending sensing connection line is formed of a second conductive layer, with an insulating layer being disposed between the first conductive layer and the second conductive layer.

* * * * *